(12) United States Patent
Yamazaki et al.

(10) Patent No.: US 11,438,083 B2
(45) Date of Patent: Sep. 6, 2022

(54) SIGNAL GENERATION DEVICE

(71) Applicant: Nippon Telegraph and Telephone Corporation, Tokyo (JP)

(72) Inventors: Hiroshi Yamazaki, Musashino (JP); Munehiko Nagatani, Musashino (JP); Hideyuki Nosaka, Musashino (JP); Masanori Nakamura, Musashino (JP); Yutaka Miyamoto, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/274,526

(22) PCT Filed: Jun. 24, 2019

(86) PCT No.: PCT/JP2019/025018
§ 371 (c)(1),
(2) Date: Mar. 9, 2021

(87) PCT Pub. No.: WO2020/054173
PCT Pub. Date: Mar. 19, 2020

(65) Prior Publication Data
US 2021/0320735 A1    Oct. 14, 2021

(30) Foreign Application Priority Data

Sep. 11, 2018    (JP) .............................. JP2018-170037

(51) Int. Cl.
*H04J 1/08*    (2006.01)
(52) U.S. Cl.
CPC ...................................... *H04J 1/08* (2013.01)
(58) Field of Classification Search
USPC ........................................................ 370/497
See application file for complete search history.

(56) References Cited

U.S. PATENT DOCUMENTS

2004/0057534 A1*  3/2004  Masenten ........... H03M 3/3287
                                                              375/316
2013/0137381 A1*  5/2013  Vassiliou ............... H04B 17/13
                                                              455/84
(Continued)

FOREIGN PATENT DOCUMENTS

JP          2018-42073 A      3/2018
JP          2018-78403 A      5/2018
WO       2017/033446 A1     3/2017

OTHER PUBLICATIONS

Charles Laperle et al., Advances in High-Speed DACs, ADCs, and DSP for Optical Coherent Transceivers, Journal of Lightwave Technology, vol. 32, No. 4, Feb. 15, 2014, pp. 629-643.
(Continued)

*Primary Examiner* — Gregory B Sefcheck
*Assistant Examiner* — Majid Esmaeilian
(74) *Attorney, Agent, or Firm* — Workman Nydegger

(57) ABSTRACT

A signal generating device includes a digital signal processing unit, M sub DACs of which an analog bandwidth is $f_B$, M being an integer equal to or greater than 2, a broadband analog signal generating unit configured to generate a broadband analog signal that includes a component of a frequency of $(M-1)f_B$ or more by using M analog signals output from the M sub DACs. The digital signal processing unit includes components for generating M original divided signals that correspond to signals obtained by dividing a desired output signal into M portions on a frequency axis and down-converting the portions to the baseband, components for generating M folded divided signals by folding back the M original divided signals on the frequency axis, and a 2M×M filter that takes the original divided signals and the folded divided signals as inputs and outputs M composite signals to be transmitted to the M sub DACs. The 2M×M filter can set (Continued)

a response function independently for each of $2M^2$ combinations of input and output.

8 Claims, 22 Drawing Sheets

(56) References Cited

U.S. PATENT DOCUMENTS

2014/0267925 A1* 9/2014 Koroglu .............. H04N 21/426
                                                       348/726
2018/0191369 A1   7/2018 Yamazaki et al.
2020/0266842 A1*  8/2020 Patel .................. H04B 1/04

OTHER PUBLICATIONS

Xi Chen et al., All-Electronic 100-GHz Bandwidth Digital-to-Analog Converter Generating PAM Signals up to 190 GBaud, Journal of Lightwave Technology, vol. 35, No. 3, Feb. 1, 2017, pp. 411-417.

Teruo Jyo et al., An 80-Gbaud Transmitter using Bandwidth Interleaving with Sideband Cancelling Method, Proceedings of the 48th European Microwave Conference, Sep. 25, 2018, pp. 247-250.

Dayong Zhou et al., Novel Adaptive Nonlinear Predistorters Based on the Direct Learning Algorithm, IEEE Transactions of Signal Processing, vol. 55, No. 1, Jan. 2007, pp. 120-133.

* cited by examiner

SIGNAL GENERATION DEVICE

TECHNICAL FIELD

The present invention relates to a signal generating device that is used for a high-speed signal transmission system, for example, and in which a digital-analog converter is used.

BACKGROUND ART

As represented by widespread use of smartphones, the internet traffic continues to increase day by day, and an increase in the capacities of optical fiber communications, wireless communications, line telecommunications, and the like as well as their advanced functionalities are required. As an elemental technology for realizing increased capacities and advanced functionalities of systems, development of efficient network configurations, advanced digital modulation and demodulation systems, optical and electronic devices operable at a high speed, and the like are currently underway. For instance, focusing on a transmission side circuit of a communication device, studies are actively undertaken to perform processing such as advanced multi-level modulation and waveform shaping in the level of digital signals using a digital signal processor (DSP), which is a processor dedicated to digital signal processing.

In introducing such a digital signal processing technology using the DSP, a digital-to-analog converter (DAC) that converts a digital signal generated by the DSP into a final high-speed analog signal and that is operable at a high speed is essential. However, the DAC manufactured using a current CMOS platform has an analog output bandwidth of about 20 GHz, which is insufficient and causes one of bottlenecks in realizing an increase in the capacity of a communication system. As a technology for resolving this, a signal generating device is proposed that can generate a signal of a bandwidth that is broader than an output bandwidth of a single DAC by using a plurality of sub DACs and a high-speed analog device such as a mixer or a multiplexer.

NPL 1 proposes a technology in which two sub DACs are used and an output signal frequency of one sub DAC is up-converted by using a multiplier and then added to an output signal of the other sub DAC to generate a signal of a bandwidth that is broader than an output bandwidth of a single sub DAC. Furthermore, the generation of a broadband signal with a configuration in which the principle of NPL 1 is extended to three sub DACs is reported in NPL 2. Furthermore, PTL 3 proposes a technology in which pre-processing performed through digital signal processing is used to eliminate the need for a conventionally required analog frequency filter in the generation of a broadband signal through upconversion performed using a multiplier. Also, PTL 1 discloses means for generating a broadband signal with a configuration in which a plurality of sub DACs and an analog multiplexer are used.

CITATION LIST

Patent Literature

[PTL 1] WO 2017/033446
[PTL 2] Japanese Patent Application Publication No. 2018-42073
[PTL 3] Japanese Patent Application Publication No. 2018-78403

Non Patent Literature

[NPL 1] C. Laperle and M. O'Sullivan, "Advances in High-Speed DACs, ADCs, and DSP for Optical Coherent Transceivers", J. Lightw. Technol., vol.32, no.4, pp.629-643 (2014)
[NPL 2] X. Chen, S. Chandrasekhar, S. Randel, G. Raybon, A. Adamiecki, P. Pupalaikis, P. Winzer, "All-electronic 100 GHz bandwidth digital-to-analog converter generating PAM signals up to 190 GBaud", J. Lightw. Technol vol.35, no.3, pp.411-417 (2017)
[NPL 3] T. Jyo, H. Yamazaki, M. Nagatani, H. Hamada, H. Fukuyama, and H. Nosaka, "An 80-Gbaud Transmitter using Bandwidth Interleaving with Sideband Cancelling Method", in Proc. European Microwave Week 2018, paper EuMC15-1 (2018)
[NPL 4] D. Zhou and V. E. DeBrunner, "Novel Adaptive Nonlinear Predistorters Based on the Direct Learning Algorithm", IEEE J. Trans. Signal Process., vol.55, no.1, pp.120-133 (2007)

SUMMARY OF THE INVENTION

Technical Problem

In order to generate a high-quality signal using a broadband signal generation technology such as those described above, a technology for compensating for individual differences between sub DACs and incompleteness of an analog device is necessary.

Therefore, PTL 1 discloses a configuration in which a compensation unit for compensating for a frequency response is provided for each sub DAC in a digital signal processing unit (paragraph 0060 and 651 and 652 in FIG. 6). Also, PTL 2 discloses an optical transmission system that includes means for estimating a transfer function that is necessary to perform such compensation.

However, there is a problem in that compensation cannot be completely performed through only compensation performed for each sub DAC because, in an actual device, a frequency response difference in a case in which baseband output signals of respective sub DACs are compared to each other does not necessarily match a frequency response difference in a case in which image signals obtained by up-converting output signals of the respective sub DACs using a function of an analog device are compared to each other. Also, there is a problem in that, with the above-described compensation performed for each sub DAC, compensation cannot be completely performed with respect to signal degradation that is caused as a result of an image signal of an order that is ideally not generated being slightly generated due to incompleteness of an analog device.

The present invention was made in view of these problems, and it is an object of the present invention to provide a signal generating device that can generate a signal of a bandwidth that is broader than an output bandwidth of a single sub DAC by using a plurality of sub DACs and a high-speed analog device and that can generate a high-quality signal through highly efficient and highly precise compensation.

Means for Solving the Problem

To achieve this object, the present invention includes the following configurations.

(Configuration 1)

A signal generating device including: a digital signal processing unit; M sub DACs of which an analog bandwidth is $f_B$, M being an integer equal to or greater than 2; and a broadband analog signal generating unit configured to generate a broadband analog signal that includes a component of a frequency of $(M-1)f_B$ or more by using M analog signals output from the M sub DACs, wherein the digital signal processing unit includes means for generating M original divided signals that correspond to signals obtained by dividing a desired output signal into M portions on a frequency axis and down-converting the portions to the baseband, means for generating M folded divided signals by folding back the M original divided signals on the frequency axis, and a 2M×M filter that takes the M original divided signals and the M folded divided signals as inputs and outputs M composite signals to be transmitted to the M sub DACs, and the 2M×M filter is capable of setting a response function independently for each of $2M^2$ combinations of input and output.

(Configuration 2)

The signal generating device according to Configuration 1, wherein the broadband analog signal generating unit is any of an analog multiplexer that outputs two input signals while switching the input signals at high speed at a constant frequency, a circuit in which the analog multiplexer is connected in the form of a multistage tree, a circuit in which at least M-1 input signals of M input signals are up-converted in frequencies by using a mixer, and then combined and output, and a circuit in which the analog multiplexer and the mixer are used in combination.

(Configuration 3)

The signal generating device according to Configuration 1, wherein the broadband analog signal generating unit is an IQ modulator circuit that is constituted by two mixers, a combiner, and a 90-degree phase shifter.

(Configuration 4)

The signal generating device according to any one of Configurations 1 to 3, wherein, when $R_{kp}(f)$ represents a frequency response of the broadband analog signal generating unit, the response function $G_{mq}(f)$ of the 2M×M filter independently set for each of $2M^2$ combinations of input and output is determined by the following expression $$\begin{pmatrix} G_{11}(f) & \cdots & G_{1M}(f) \\ \vdots & \ddots & \vdots \\ G_{M1}(f) & \cdots & G_{MM}(f) \\ \widetilde{G}_{1(M+1)}(f) & \cdots & \widetilde{G}_{1(2M)}(f) \\ \vdots & \ddots & \vdots \\ \widetilde{G}_{M(M+1)}(f) & \cdots & \widetilde{G}_{M(2M)}(f) \end{pmatrix} = \text{Formula 1}$$

$$\begin{pmatrix} R_{11}(f) & \cdots & R_{1M}(f) & R_{1(M+1)}(f) & \cdots & R_{1(2M)}(f) \\ \vdots & \ddots & \vdots & \vdots & \ddots & \vdots \\ R_{M1}(f) & \cdots & R_{MM}(f) & R_{M(M+1)}(f) & \cdots & R_{M(2M)}(f) \\ \widetilde{R}_{1(M+1)}(f) & \cdots & \widetilde{R}_{1(2M)}(f) & \widetilde{R}_{11}(f) & \cdots & \widetilde{R}_{1M}(f) \\ \vdots & \ddots & \vdots & \vdots & \ddots & \vdots \\ \widetilde{R}_{M(M+1)}(f) & \cdots & \widetilde{R}_{M(2M)}(f) & \widetilde{R}_{M1}(f) & \cdots & \widetilde{R}_{MM}(f) \end{pmatrix}^{-1}$$

$$\begin{pmatrix} 1 & \cdots & 0 \\ \vdots & \ddots & \vdots \\ 0 & \cdots & 1 \\ 0 & \cdots & 0 \\ \vdots & \ddots & \vdots \\ 0 & \cdots & 0 \end{pmatrix}$$

where the tilde symbol~represents a folding operation in which an original function is folded back with $f_B/2$ being the center of the fold to take the complex conjugate, $f_B$ being the analog bandwidth of the sub DACs.

(Configuration 5)

The signal generating device according to any one of Configurations 1 to 4, wherein the digital signal processing unit includes at least either a main nonlinear filter that is connected to an input side of the means for generating the original divided signals or M sub nonlinear filters that are respectively connected to M outputs of the 2M×M filter.

Effects of the Invention

As described above, according to the present invention, a high-quality signal can be generated through highly precise compensation with a computational load smaller than those in conventional technologies, in a signal generating device that can generate a signal of a bandwidth broader than an output bandwidth of a single sub DAC by using a plurality of sub DACs and a high-speed analog device.

DESCRIPTION OF EMBODIMENTS

In the following description, only positive frequency components are shown in mathematical expressions and diagrams showing spectra for the sake of convenience, and negative frequency components are omitted. Since signals used in the following description are all real signals, a negative frequency component is a function obtained by replacing f in a positive frequency component with -f and taking the complex conjugate of the entirety. Also, a superscript asterisk (*) represents the complex conjugate.

Also, an input signal that is used as the input to a digital signal processing unit corresponds to a digital signal that is obtained by sampling a desired analog signal (which is desirable as a final output signal of the entire device). However, the sampling is not performed by actually generating the desired analog signal physically, and the input signal is virtually generated in a digital region based on a transmission digital data sequence, a modulation format, a desired pulse shape, and the like. Such virtual generation of a digital input signal is performed not only in the present invention, and is commonly performed as transmission side processing of a communication DSP.

Also, in the present specification, operation will be described mainly focusing on the spectrum of a signal, and in the description of a digital signal, the spectrum implicitly means a spectrum in the first Nyquist zone, i.e., a spectrum that is defined in a frequency range from direct current to ½ of the sampling rate of the digital signal. Also, the sampling rate of a digital signal is set to a value that is greater than two times the maximum frequency of the original signal, unless otherwise stated. For example, a signal that is made of a component in a frequency range from 0 to $f_{MAX}$ is treated as a digital signal of which the sampling rate is greater than $2f_{MAX}$.

Also, in the present specification, an analog bandwidth of a DAC means an upper limit frequency of an analog signal that can be output by the DAC without significant signal degradation. Specifically, in many cases, the analog bandwidth means a frequency at which the intensity of an output analog signal attenuates by a predetermined value when compared to the vicinity of DC. A threshold value of the reduction amount of the signal intensity that defines the analog bandwidth is to be set according to the spectrum shape of a signal to be generated, characteristics of a reception side device, and the like, but typically, the threshold value is to be set to about 3 to 6 dB and to be not greater than about 20 dB.

The following describes embodiments of the present invention in detail with reference to the drawings.

First Embodiment

Figure 1:
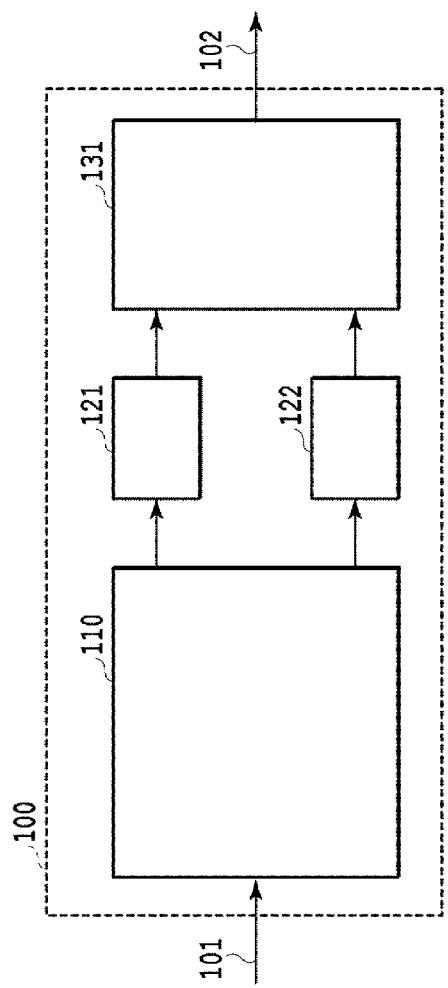
FIG. 1 is a diagram showing a configuration of a signal generating device according to a first embodiment of the present invention.

FIG. 1 is a diagram schematically showing a configuration of a signal generating device according to a first embodiment of the present invention. A signal generating device 100 is constituted by a digital signal processing unit 110 to which an input signal 101 is input, sub DACs 121 and 122, and a broadband analog signal generating unit 131 that outputs an output signal 102. When the number of sub DACs is represented by M (M is an integer equal to or greater than 2), M=2 in this example, but the operation principle can also be extended to a configuration in which M≥3.

Assume that the analog bandwidth of the sub DACs 121 and 122 is $f_B$. The broadband analog signal generating unit 131 has a function of outputting a broadband signal having a frequency range from 0 to about $2f_B$ as the output signal 102 by generating images by shifting the frequency of each of signals input from the sub DACs 121 and 122 by an integral multiple of $f_B$ and superimposing the images.

Figure 2:
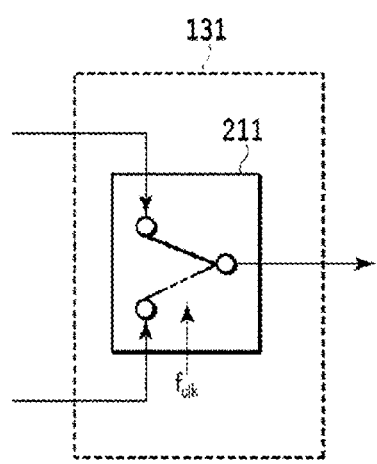
FIG. 2 is a diagram showing a configuration example 1 of a broadband analog signal generating unit shown in FIG. 1.
Figure 3:
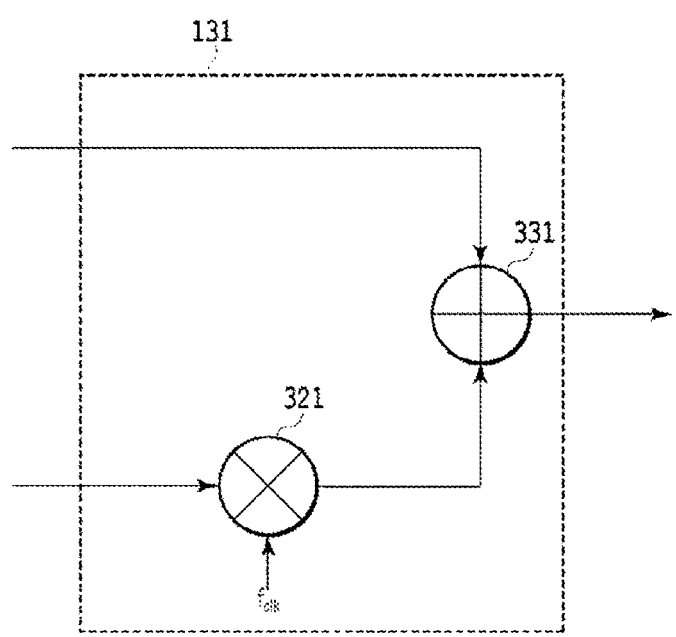
FIG. 3 is a diagram showing a configuration example 2 of the broadband analog signal generating unit shown in FIG. 1.
Figure 4:
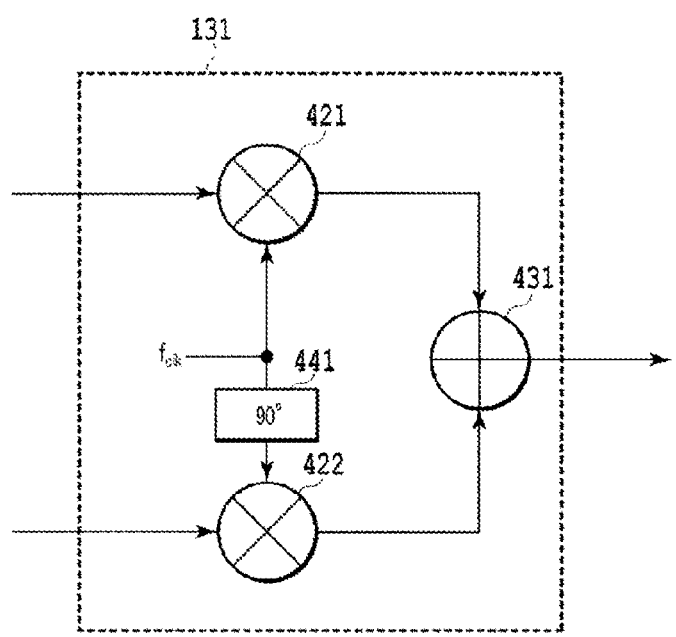
FIG. 4 is a diagram showing a configuration example 3 of the broadband analog signal generating unit shown in FIG. 1.

Examples of specific configurations of the broadband analog signal generating unit 131 include a configuration in which an analog multiplexer 211 is used as shown in FIG. 2, a configuration in which a mixer 321 and a combiner 331 are used as shown in FIG. 3, and an IQ modulator circuit that is constituted by mixers 421 and 422, a combiner 431, and a 90-degree phase shifter 441 as shown in FIG. 4. Although details of the operation of the configurations shown in FIGS. 2 to 4 will be described later, in any of the configuration examples shown in FIGS. 2 to 4, the output signal 102 can be obtained as a broadband signal spanning the range from 0 to $2f_B$, which is two times the analog bandwidth of the sub DACs 121 and 122, if appropriate signal processing is performed in the digital signal processing unit 110.

Figure 5:
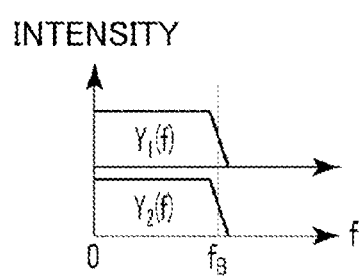
FIG. 5 is a diagram showing spectra of output signals of respective sub DACs shown in FIG. 1.
Figure 6:
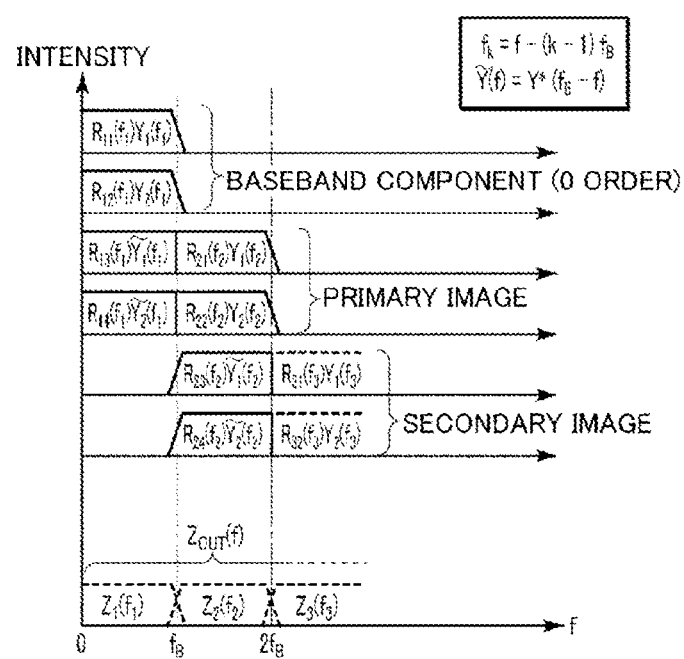
FIG. 6 is a diagram showing a spectrum of an output signal of the broadband analog signal generating unit shown in FIG. 1.

FIG. 5 is a diagram showing spectra of output signals from the sub DACs 121 and 122 in the first embodiment shown in FIG. 1, and FIG. 6 is a diagram showing a spectrum of the output signal 102 from the broadband analog signal generating unit 131.

FIG. 5 shows the spectra of the output signals from the sub DACs 121 and 122 as $Y_1(f)$ and $Y_2(f)$. FIG. 6 shows spectra of signals corresponding to the respective sub DACs from top to bottom in the order of image signals with baseband components (0 order) arranged at the top. The spectrum of the output signal 102 from the broadband analog signal generating unit 131 is shown as $Z_{OUT}(f)$ on the f axis at the bottom in FIG. 6. Explanation of symbols of spectral components of the signals used in the drawing is given at upper right in FIG. 6.

As described later, response characteristics of the sub DACs 121 and 122 are included in the model of the broadband analog signal generating unit 131 for the sake of convenience of description, and accordingly, $Y_1(f)$ and $Y_2(f)$ are spectra of the output signals in a case in which it is assumed that the sub DACs 121 and 122 have completely flat ideal frequency responses. That is, $Y_1(f)$ and $Y_2(f)$ match spectra of input digital signals input to the sub DACs 121 and 122 (to be precise, the spectra match in a frequency range that corresponds to the first Nyquist zone of the digital signals).

$Y_1(f)$ and $Y_2(f)$ are spectra made of components that are substantially in a frequency range from 0 to $f_B$. $Z_{OUT}(f)$ is generated from baseband components and primary and secondary images of $Y_1(f)$ and $Y_2(f)$. However, here, a k-th image means a signal that is shifted from the original signal by $kf_B$ on the frequency axis. When a k-th image (k=1, 2, . . . ) of $Y_m(f)$ (m=1, 2) is represented by $Y_{m,k}(f)$, $Y_{m,k}(f)$ can be expressed by Expression (1).

Formula 2

$$Y_{m,k}(f) = Y^*_{hd\ m}(kf_B - f) + Y_m(f - kf_B) = Y^*_m(f_B - k) + Y_m(f_{k+1}) = \widetilde{Y_m}(f_k) + Y_m(f_{k+1}) \quad (1)$$

$f_k$ represents a frequency when the origin is $f=(k-1)f_B$, i.e., $f_k = f-(k-1)f_B$. Also, the tilde symbol (~) represents a folding operation in which the original function is folded back with $f_B/2$ being the center of the fold to take the complex conjugate, and the following expression holds.

$$\widetilde{Y_m}(f) = Y^*_m(f_B - f) \quad \text{Formula 3}$$

The first term and the second term on the right side of Expression (1) correspond to a lower side band and an upper side band of the k-th image, respectively. The lower side band has a component substantially in a range from $(k-1)f_B$ to $kf_B$ on the low-frequency side with $kf_B$ being the center, and the upper side band has a component substantially in a range from $kf_B$ to $(k+1)f_B$ on the high-frequency side with $kf_B$ being the center.

In general, $Z_{OUT}(f)$ is obtained by adding these images and baseband components after multiplying these images and baseband components by different response functions. It can be understood from FIG. 6 that, a component of $Z_{OUT}(f)$ for which $f=(k-1)f_B$ to $kf_B$ is substantially constituted by upper side bands of k-1-th images of $Y_1(f)$ and $Y_2(f)$ and lower side bands of k-th images of $Y_1(f)$ and $Y_2(f)$ (provided that upper side bands of 0-order images=baseband components). That is, it can be understood that when $Z_{OUT}(f)$ is divided substantially by the frequency $f_B$ into portions and the portions are represented by $Z_1(f_1)$, $Z_2(f_2)$, . . . , in that order from the low-frequency side, each $Z_k(f_k)$ can be expressed by superimposing a total of four spectral components, i.e., two k-1-th upper side bands and two k-th lower side bands. At this time, $Z_{k-1}(f_{k-1})$ and $Z_k(f_k)$ may slightly overlap around $kf_B$. $Z_k(f)$ in which the variable $f_k$ is replaced with f corresponds to a signal that is obtained by down-converting $Z_k(f_k)$ to the baseband. A relationship between $Z_k(f)$ and $Y_1(f)$ and $Y_2(f)$ can be expressed by the following Expression (2).

Formula 4

$$\begin{pmatrix} Z_1(f) \\ Z_2(f) \\ \vdots \end{pmatrix} = \begin{pmatrix} R_{11}(f) & R_{12}(f) & R_{13}(f) & R_{14}(f) \\ R_{21}(f) & R_{22}(f) & R_{23}(f) & R_{24}(f) \\ \vdots & & & \end{pmatrix} \begin{pmatrix} Y_1(f) \\ Y_2(f) \\ \widetilde{Y_1}(f) \\ \widetilde{Y_2}(f) \end{pmatrix} \quad (2)$$

$R_{kp}(f)$ represents a frequency response of the broadband analog signal generating unit 131, and when p=1 to 2 (1 to M), $R_{kp}(f)$ represents a frequency response with respect to an upper side band of a k-1-th image of $Y_p(f)$, and when p=3 to 4 (M+1 to 2M), $R_{kp}(f)$ represents a frequency response with respect to a lower side band of a k-th image of $Y_{p-4}(f)$.

$R_{kp}(f)$ includes not only a response with respect to an image that is generated through ideal operation but also a response with respect to a spurious component that is generated due to incompleteness of the device or the like. Also, for the sake of convenience of description, it is assumed that $R_{kp}(f)$ also includes responses (including amplitude and phase) of the sub DACs 121 and 122 at prior stages and connection portions between the sub DACs and the broadband analog signal generating unit 131. If attenuation on the high-frequency side of the sub DAC 121 is large when compared to the sub DAC 122, the high-frequency side of $R_{k1}(f)$ and the low-frequency side of $R_{k3}(f)$ are large when compared to $R_{k2}(f)$ and $R_{k4}(f)$.

Likewise, a difference (skew) in signal delay time generated by cables between the broadband analog signal generating unit 131 and the sub DACs 121 and 122 is included in phase characteristics of $R_{kp}(f)$. Accordingly, $Y_1(f)$ and $Y_2(f)$ can be considered as being spectra of signals that are obtained by converting input digital signals input to the sub DACs 121 and 122 as-is to analog signals (to be precise, the spectra match in a frequency range that corresponds to the first Nyquist zone of the digital signals).

Note that the influence of noise and nonlinear distortion is not taken into consideration in Expression (2). Although the final output is affected by noise, which is added to the right side of Expression (2), and nonlinear distortion in the form of an image or the like that appears at a position that is not taken into consideration in Expression (2) and FIG. 2, the signal generating device 100 is usually used under conditions where the influence of noise and nonlinear distortion is sufficiently small.

For example, if the signal amplitude becomes too small in the analog region (after output from the sub DACs), the influence of noise becomes large, and if the signal amplitude becomes too large, the influence of nonlinear distortion becomes large, and accordingly, adjustment is made to obtain the optimum amplitude according to characteristics of the device to be used. Optimization of a DC bias also affects the magnitude of nonlinear distortion. Such adjustment is not specially performed only in the signal generating device of the present invention but is commonly performed in devices that generate high-speed signals.

Also, when M sub DACs are used, the frequency range in which a waveform can be obtained as the output of the broadband analog signal generating unit is usually from 0 to $Mf_B$ (in this example, 0 to $2f_B$). Unnecessary images may remain on the high-frequency side of $Mf_B$, but these images can be easily removed by an analog filter on the transmission side or the reception side or a digital filter on the reception side.

Therefore, the following description focuses only on elements for which k=1 to M (in this example, 1 to 2), and elements for which k>M are ignored. That is, the frequency response of the broadband analog signal generating unit 131 can be treated as an M row by 2M column (in this example, 2 row by 4 column) matrix with respect to each f, focusing only on $R_{kp}(f)$: k=1 to M (in this example, 1 to 2) in Expression (2).

As described above, the present invention is based on an idea of expressing the operation of the broadband analog generating unit 131 by using a total of 2M input signals, which are input signals from M sub DACs and signals obtained by inverting the input signals on the frequency axis, M output signals corresponding to signals that are obtained by dividing an output signal into M bands and down-converting the divided portions to the baseband, and a response function of an M row by 2M column matrix connecting the input signals and the output signals, the idea being not found in conventional technologies.

Here, details of specific configuration examples of the broadband analog signal generating unit 131 will be described in connection with Expression (2).

First, a configuration of the broadband analog signal generating unit 131 shown in FIG. 2 in which the analog multiplexer 211 is used will be described. The analog multiplexer 211 is a switch (selector) circuit that outputs two input analog signals while switching the signals at high speed at a clock frequency $f_{clk}$. As described in detail in PTL 1, ideally, an output signal from the analog multiplexer 211 can be expressed as a signal that is obtained by adding baseband components of two input analog signals and image components of which the center is the frequency $f_{clk}$. Also, ideally, a phase difference between the baseband components is zero and a phase difference between the image components is Π. Also, when an amplitude ratio between the baseband signals and the image signals is 1:1/r, if the transition time of switching performed by the analog multiplexer 211 is zero, r=Π/2, but actually, the transition time is finite, and in some cases, r is about 2.

The clock frequency can be set in two ways, and there is a case in which $f_{clk}=2f_B$ (first to fifth embodiments in PTL 1) and a case in which $f_{clk}=f_B$ (sixth and seventh embodiments in PTL 1). For the sake of convenience, the former case will be referred to type 1, and the latter case will be referred to type 2.

In the case of type 1, if the operation of the analog multiplexer 211 is ideal, images are generated only around $f_{clk}=2f_B$ (to be precise, images are generated only around frequencies that are odd multiples of $f_{clk}$, but it is sufficient to consider only images around $f_{clk}=2f_B$ in the frequency range of concern, which is from 0 to $2f_B$), and accordingly, Expression (2b) can be expressed as follows.

Formula 5

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} = \begin{pmatrix} 1 & 1 & 0 & 0 \\ 0 & 0 & 1/r & -1/r \end{pmatrix} \quad (2b)$$

Here, an image around $f_{clk}$, which is one time the clock frequency, is usually called a primary image, but in the present application, the order of an image is defined using $f_B$ as a unit, following the way of thinking shown in FIG. 2, and accordingly, an image around $f_{clk}=2f_B$ corresponds to a secondary image.

Also, in the case of type 2, if the operation of the analog multiplexer 211 is ideal, images are generated only around $f_{clk}=f_B$ (to be precise, images are generated only around frequencies that are odd multiples of $f_{clk}$, but it is sufficient to consider only images around $f_{clk}=f_B$ in the frequency range of concern, which is from 0 to $2f_B$), and accordingly, Expression (2c) can be expressed as follows.

Formula 6

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} = \begin{pmatrix} 1 & 1 & 1/r & -1/r \\ 1/r & -1/r & 0 & 0 \end{pmatrix} \quad (2c)$$

In this case, an image around $f_{clk}=f_B$ is a primary image in the way of thinking of the present application shown in FIG. 2 as well.

Next, a configuration of the broadband analog signal generating unit 131 shown in FIG. 3 in which the mixer 321 and the combiner 331 are used will be described. The mixer 321 up-converts one of input analog signals by a frequency $f_{clk}$ by multiplying the input analog signal by a sine wave of the frequency $f_{clk}$. In this configuration, if $f_{clk}=f_B$, the output signal 102 is obtained by adding a primary image of an output analog signal from the sub DAC 122 to a baseband component of an output analog signal from the sub DAC 121, and accordingly, if the operation of the mixer 321 and the combiner 331 is ideal, Expression (2d) can be expressed as follows.

Formula 7

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} = \begin{pmatrix} 1 & 0 & 0 & 1 \\ 0 & 1 & 0 & 0 \end{pmatrix} \quad (2d)$$

Next, a configuration of the broadband analog signal generating unit 131 of an IQ modulator type shown in FIG. 4 will be described. In this example, the two mixers 421 and 422 are driven using sine waves that differ from each other in phase by 90 degrees, and output signals from the respective mixers are added by the combiner 431 and then output. The mixers 421 and 422 output primary images that differ from each other in phase by 90 degrees, and accordingly, when $fclk=f_B$, if the operation of the mixers 421 and 422 and the combiner 431 is ideal, Expression (2e) can be expressed as follows.

Formula 8

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} = \begin{pmatrix} 0 & 0 & 1 & j \\ 1 & j & 0 & 0 \end{pmatrix} \quad (2e)$$

PTL 1 to PTL 3 disclose details of signal processing to be performed in the digital signal processing unit 110, assuming that ideal operation such as those expressed by Expressions (2b) to (2d) is performed, or while taking only response characteristics of the sub DACs 121 and 122 into consideration in such ideal operation. However, an actual device does not operate as expressed by Expressions (2b) to (2d).

Usually, $R_{kp}(f)$ is not a constant as in Expressions (2b) and (2c), but depends on the frequency, and the frequency dependence (waveform of the response spectrum) also varies between elements. Also, elements that are zero in Expressions (2b) to (2d) are actually not zero. For example, if the configuration example shown in FIG. 2 is driven under the condition of type 2, ideally, secondary images are not generated, and accordingly, $R_{23}(f)=R_{24}(f)=0$ in Expression (2c), but actually secondary images are also generated due to incompleteness of the device and the responses $R_{23}(f)$ and $R_{24}(f)$ are not zero. As described later, the present invention is characterized in that highly precise compensation can be performed with respect to such non-ideal responses as well.

Figure 7:
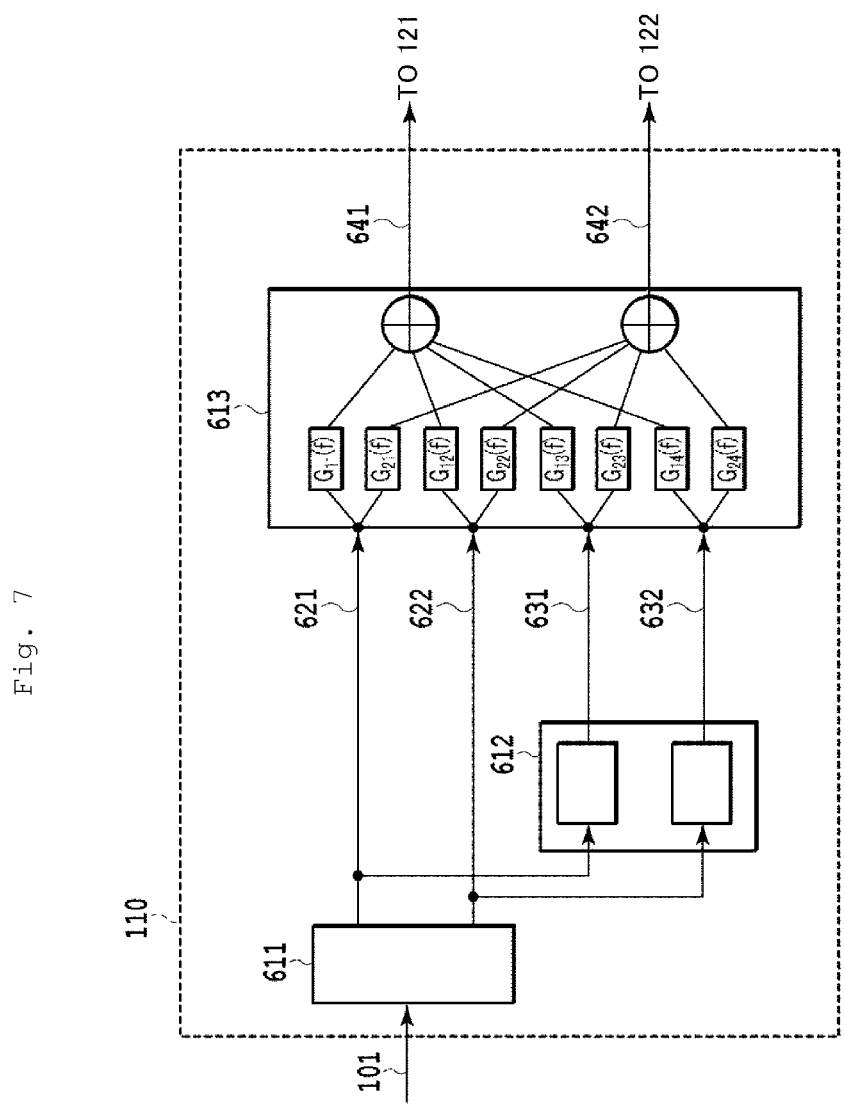
FIG. 7 is a functional block diagram of the inside of a digital signal processing unit shown in FIG. 1.

FIG. 7 shows a functional block diagram of the inside of the digital signal processing unit 110 shown in FIG. 1. In the digital signal processing unit 110, digital signals to be transmitted to the sub DACs 121 and 122 are generated according to characteristics of the broadband analog signal generating unit 131 generally expressed by Expression (2) such that a desired analog signal can be obtained as the final output signal 102. The input signal 101 input to the digital signal processing unit 110 corresponds to a digital signal that is obtained by sampling a desired analog signal, and is virtually generated in a digital region. Assume that $X_{target}(f)$ represents the spectrum of the input signal 101. $X_{target}(f)$ is a spectrum made of a component that is substantially in a frequency range from 0 to $Mf_B$ (in this example, from 0 to $2f_B$).

A band dividing unit 611 generates original divided signals 621 and 622 that correspond to signals obtained by dividing the input signal 101 substantially by the frequency $f_B$ and down-converting the divided portions of the input signal 101 to the baseband. When spectra of the original divided signals 621 and 622 are represented by $X_1(f)$ and $X_2(f)$, a relationship expressed by the following Expression (3) is satisfied.

Formula 9

$$X_{target}(f) = X_1(f) + X_2(f - f_B) \quad (3)$$
$$= X_1(f_1) + X_2(f_2)$$

At this time, $X_{k-1}(f_{k-1})$ and $X_k(f_k)$ may slightly overlap around $kf_B$. Each $X_k(f)$ is a spectrum made of a component that is substantially in the frequency range from 0 to $f_B$. The original divided signals 621 and 622 have a bandwidth that is about 1/M (about ½) of the bandwidth of the input signal 101, and accordingly, can be expressed using a sampling rate that is about 1/M (about ½) of the sampling rate of the input signal 101. Therefore, it is desirable that digital processing performed in the band dividing unit 211 includes processing for performing downsampling after the bandwidth division.

In a spectrum folding unit 612, folded divided signals 631 and 632 are generated by folding back the original divided signals 621 and 622 on the frequency axis with $f_B/2$ being the center of the fold to take the complex conjugate. Spectra of the folded divided signals 631 and 632 can be expressed as follows using a tilde (~) similarly to Expression (1).

$$\widetilde{X_1}(f) \sim \widetilde{X_2}(f) : \widetilde{X_m}(f) = X^*_m(f_B - f) \quad \text{Formula 10}$$

A 2M×M filter (4×2 filter) 613 takes the original divided signals 621 and 622 and the folded divided signals 631 and 632 as inputs and generates composite signals 641 and 642 to be transmitted to the sub DACs 121 and 122. As described above, in the model of Expression (2), $R_{km}(f)$ also includes responses of the sub DACs 121 and 122 and connection portions between the sub DACs and the broadband signal generating unit 131, and accordingly, spectra of these composite signals 641 and 642 are $Y_1(f)$ and $Y_2(f)$ in Expressions (1) and (2) (to be precise, since the composite signals 641 and 642 are digital signals, spectra of the composite signals in the first Nyquist zone match $Y_1(f)$ and $Y_2(f)$ in Expressions (1) and (2)).

The operation of the 4×2 filter 613 can be expressed by the following Expression (4).

Formula 11

$$\begin{pmatrix} Y_1(f) \\ Y_2(f) \end{pmatrix} = \begin{pmatrix} G_{11}(f) & G_{12}(f) & G_{13}(f) & G_{14}(f) \\ G_{21}(f) & G_{22}(f) & G_{23}(f) & G_{24}(f) \end{pmatrix} \begin{pmatrix} X_1(f) \\ X_2(f) \\ \widetilde{X_1}(f) \\ \widetilde{X_2}(f) \end{pmatrix} \quad (4)$$

$G_{mq}(f)$ represents a response function of the 4×2 filter (2M×M filter) 613, m=1 to 2 (1 to M) corresponds to the composite signals 641 and 642 that are obtained as outputs, q=1 to 2 (1 to M) corresponds to $X_q(f)$, and q=3 to 4 (M+1 to 2M) corresponds to $$\widetilde{X_{q-4}}(f) \quad \text{Formula 12}$$

As described above, the 4×2 filter 613 is a filter that obtains the composite signals 641 and 642 by multiplying the original divided signals 621 and 622 and the folded divided signals 631 and 632 by response functions $G_{mq}(f)$ that can be independently set, and then superimposing the results. The original divided signals 621 and 622 and the folded divided signals 631 and 632 are made of components of which the frequency is substantially $f_B$ or less, and accordingly, the composite signals 641 and 642 are also made of components of which the frequency is substantially $f_B$ or less, and can be converted to analog signals by the sub DACs 121 and 122 of which the analog bandwidth is substantially $f_B$, with no problem.

Incidentally, if the influence of noise and nonlinear distortion is ignored, the following Expression (5) holds as a result of the response $G_{mq}(f)$ of the 4×2 filter 613 being appropriately set.

Formula 13

$$\begin{pmatrix} Z_1(f) \\ Z_2(f) \end{pmatrix} = \begin{pmatrix} X_1(f) \\ X_2(f) \end{pmatrix} \quad (5)$$

That is, in the spectrum $Z_{OUT}(f)$ of the final output signal 102 of the signal generating device 100, the range where the frequency is substantially from 0 to $2f_B$ substantially matches $X_{target}(f)$.

The following describes a method for finding $G_{mq}(f)$ that satisfies Expression (5). First, the folding operation is performed on both sides of Expression (4) to obtain the following Expression (6).

Formula 14

$$\begin{pmatrix} \widetilde{Y_1}(f) \\ \widetilde{Y_2}(f) \end{pmatrix} = \begin{pmatrix} \widetilde{G_{11}}(f) & \widetilde{G_{12}}(f) & \widetilde{G_{13}}(f) & \widetilde{G_{14}}(f) \\ \widetilde{G_{21}}(f) & \widetilde{G_{22}}(f) & \widetilde{G_{23}}(f) & \widetilde{G_{24}}(f) \end{pmatrix} \begin{pmatrix} \widetilde{X_1}(f) \\ \widetilde{X_2}(f) \\ X_1(f) \\ X_2(f) \end{pmatrix} \quad (6)$$

Here, left two columns and right two columns (left M columns and right M columns) of the G matrix on the right side of Expression (6) are exchanged and upper two rows and lower two rows (upper M rows and lower M rows) of the X vector are exchanged to obtain the following Expression (7).

Formula 15

$$\begin{pmatrix} \widetilde{Y_1}(f) \\ \widetilde{Y_2}(f) \end{pmatrix} = \begin{pmatrix} \widetilde{G_{13}}(f) & \widetilde{G_{14}}(f) & \widetilde{G_{11}}(f) & \widetilde{G_{12}}(f) \\ \widetilde{G_{23}}(f) & \widetilde{G_{24}}(f) & \widetilde{G_{21}}(f) & \widetilde{G_{22}}(f) \end{pmatrix} \begin{pmatrix} X_1(f) \\ X_2(f) \\ \widetilde{X_1}(f) \\ \widetilde{X_2}(f) \end{pmatrix} \quad (7)$$

From Expressions (2), (4), and (7), the following Expression (8) is obtained.

Formula 16

$$\begin{pmatrix} Z_1(f) \\ Z_2(f) \end{pmatrix} = \begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} \quad (8)$$

$$\begin{pmatrix} G_{11}(f) & G_{12}(f) & G_{13}(f) & G_{14}(f) \\ G_{21}(f) & G_{22}(f) & G_{23}(f) & G_{24}(f) \\ \widetilde{G_{13}}(f) & \widetilde{G_{14}}(f) & \widetilde{G_{11}}(f) & \widetilde{G_{12}}(f) \\ \widetilde{G_{23}}(f) & \widetilde{G_{24}}(f) & \widetilde{G_{21}}(f) & \widetilde{G_{22}}(f) \end{pmatrix} \begin{pmatrix} X_1(f) \\ X_2(f) \\ \widetilde{X_1}(f) \\ \widetilde{X_2}(f) \end{pmatrix}$$

Therefore, Expression (5) holds if the following Expression (9) holds.

Formula 17

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} \quad (9)$$

$$\begin{pmatrix} G_{11}(f) & G_{12}(f) & G_{13}(f) & G_{14}(f) \\ G_{21}(f) & G_{22}(f) & G_{23}(f) & G_{24}(f) \\ \widetilde{G_{13}}(f) & \widetilde{G_{14}}(f) & \widetilde{G_{11}}(f) & \widetilde{G_{12}}(f) \\ \widetilde{G_{23}}(f) & \widetilde{G_{24}}(f) & \widetilde{G_{21}}(f) & \widetilde{G_{22}}(f) \end{pmatrix} \begin{pmatrix} 1 & 0 & 0 & 0 \\ 0 & 1 & 0 & 0 \end{pmatrix}$$

Expression (9) will be rearranged with respect to $G_{mq}(f)$. First, each side of Expression (9) is divided into left two columns (M columns) and right two columns (M columns) to obtain the following Expressions (10) and (11).

Formula 18

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} \begin{pmatrix} G_{11}(f) & G_{12}(f) \\ G_{21}(f) & G_{22}(f) \\ \widetilde{G_{13}}(f) & \widetilde{G_{14}}(f) \\ \widetilde{G_{23}}(f) & \widetilde{G_{24}}(f) \end{pmatrix} = \begin{pmatrix} 1 & 0 \\ 0 & 1 \end{pmatrix} \quad (10)$$

Formula 19

$$\begin{pmatrix} R_{11}(f) & R_{12}(f) & R_{13}(f) & R_{14}(f) \\ R_{21}(f) & R_{22}(f) & R_{23}(f) & R_{24}(f) \end{pmatrix} \begin{pmatrix} G_{13}(f) & G_{14}(f) \\ G_{23}(f) & G_{24}(f) \\ \widetilde{G_{11}}(f) & \widetilde{G_{12}}(f) \\ \widetilde{G_{21}}(f) & \widetilde{G_{22}}(f) \end{pmatrix} = \begin{pmatrix} 0 & 0 \\ 0 & 0 \end{pmatrix} \quad (11)$$

Next, with respect to Expression (11), the folding operation is performed on both sides, left two columns and right two columns (left M columns and right M columns) of the R matrix are exchanged, and upper two rows and lower two rows (upper M rows and lower M rows) of the G matrix are exchanged to obtain the following Expression (12).

Formula 20

$$\begin{pmatrix} \widetilde{R_{13}}(f) & \widetilde{R_{14}}(f) & \widetilde{R_{11}}(f) & \widetilde{R_{12}}(f) \\ \widetilde{R_{23}}(f) & \widetilde{R_{24}}(f) & \widetilde{R_{21}}(f) & \widetilde{R_{22}}(f) \end{pmatrix} \begin{pmatrix} G_{11}(f) & G_{12}(f) \\ G_{21}(f) & G_{22}(f) \\ \widetilde{G_{13}}(f) & \widetilde{G_{14}}(f) \\ \widetilde{G_{23}}(f) & \widetilde{G_{24}}(f) \end{pmatrix} = \begin{pmatrix} 0 & 0 \\ 0 & 0 \end{pmatrix} \quad (12)$$

From Expressions (10) and (12), the following Expression (13) is obtained, and by multiplying both sides of Expression (13) by an inverse matrix of the R matrix, the following Expression (14) is obtained.

Formula 21

$$\begin{pmatrix} R_{11}(f) & R_{12}(f) & R_{13}(f) & R_{14}(f) \\ R_{21}(f) & R_{22}(f) & R_{23}(f) & R_{24}(f) \\ \widetilde{R_{13}}(f) & \widetilde{R_{14}}(f) & \widetilde{R_{11}}(f) & \widetilde{R_{12}}(f) \\ \widetilde{R_{23}}(f) & \widetilde{R_{24}}(f) & \widetilde{R_{21}}(f) & \widetilde{R_{22}}(f) \end{pmatrix} \begin{pmatrix} G_{11}(f) & G_{12}(f) \\ G_{21}(f) & G_{22}(f) \\ \widetilde{G_{13}}(f) & \widetilde{G_{14}}(f) \\ \widetilde{G_{23}}(f) & \widetilde{G_{24}}(f) \end{pmatrix} = \begin{pmatrix} 1 & 0 \\ 0 & 1 \\ 0 & 0 \\ 0 & 0 \end{pmatrix} \quad (13)$$

Formula 22

$$\begin{pmatrix} G_{11}(f) & G_{12}(f) \\ G_{21}(f) & G_{22}(f) \\ \widetilde{G_{13}}(f) & \widetilde{G_{14}}(f) \\ \widetilde{G_{23}}(f) & \widetilde{G_{24}}(f) \end{pmatrix} = \begin{pmatrix} R_{11}(f) & R_{12}(f) & R_{13}(f) & R_{14}(f) \\ R_{21}(f) & R_{22}(f) & R_{23}(f) & R_{24}(f) \\ \widetilde{R_{13}}(f) & \widetilde{R_{14}}(f) & \widetilde{R_{11}}(f) & \widetilde{R_{12}}(f) \\ \widetilde{R_{23}}(f) & \widetilde{R_{24}}(f) & \widetilde{R_{21}}(f) & \widetilde{R_{22}}(f) \end{pmatrix}^{-1} \begin{pmatrix} 1 & 0 \\ 0 & 1 \\ 0 & 0 \\ 0 & 0 \end{pmatrix} \quad (14)$$

From this Expression (14), $G_{mq}(f)$ that satisfies Expression (5) can be found for given $R_{kp}(f)$.

As described above, $R_{kp}(f)$ includes all of individual differences between the response characteristics of the sub DACs 121 and 122, the skew of connection between the sub DACs 121 and 122 and the broadband analog signal generating unit 131, and response characteristics of the broadband analog signal generating unit 131 with respect to images of respective orders (including a response with respect to an image of an order that is ideally not generated, but is generated due to incompleteness of the device). Therefore, the 4×2 filter 213 in which $G_{mq}(f)$ are used as coefficients can compensate for all of the individual differences between the sub DACs, the skew, and differences between response characteristics for respective orders, and generate the composite signals 641 and 642 with which ideal DAC characteristics can be achieved by the signal generating device 100 as a whole.

Note that in order to find $G_{mq}(f)$ from Expression (14), $R_{kp}(f)$ needs to be given, but $R_{kp}(f)$ can be found through actual measurement, simulation, or the like. For example, to find $R_{kp}(f)$ through actual measurement, it is possible to consider using a method of measuring analog responses of the sub DACs 121 and 122 individually, and evaluating the response of the broadband analog signal generating unit 131 by inputting input signals of the quadruple system one-by-one.

(Comparison with Conventional Technologies)

Major characteristics of the present invention that cannot be found in conventional technologies are included in the 2M×M filter (4×2 filter) 613. The following compares the present invention with the conventional technology described in PTL 1.

Figure 8:
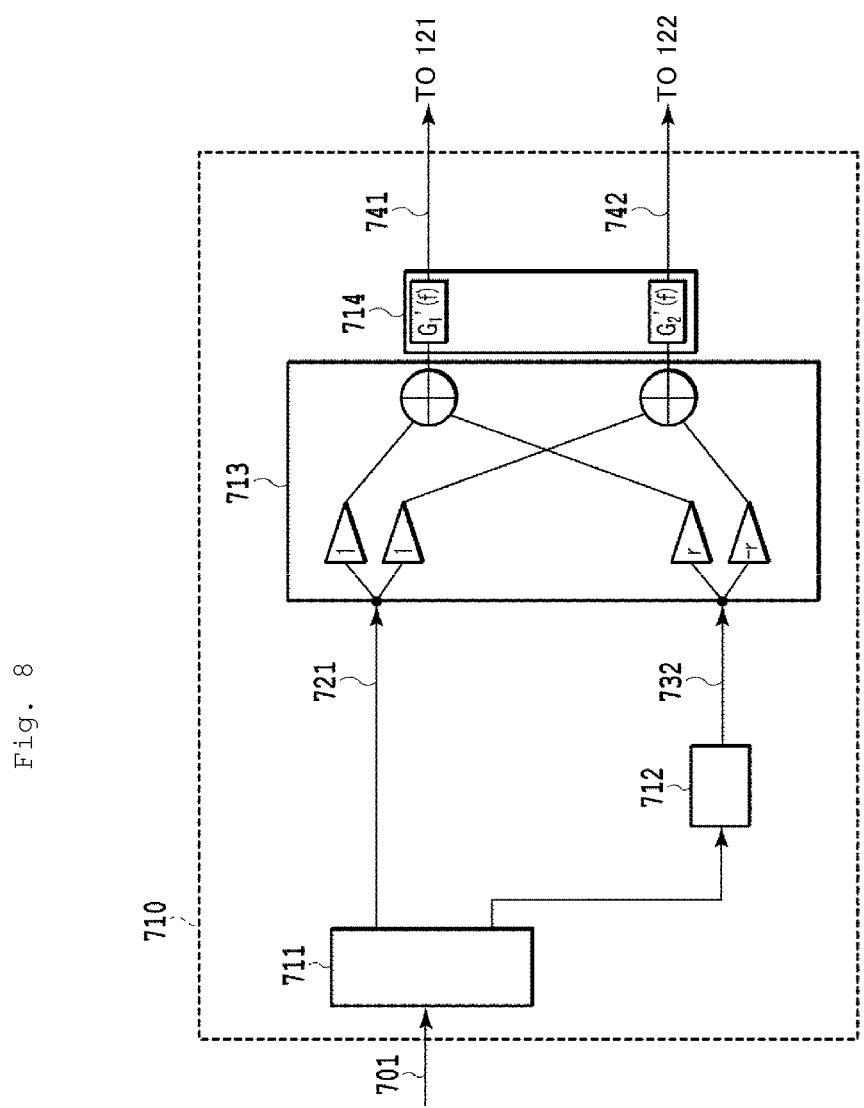
FIG. 8 is a functional block diagram of a digital signal processing unit in a conventional signal generating device under a condition (fclk=2fB) of type 1.

FIG. 8 shows a functional block diagram of a digital signal processing unit 710 in a conventional signal generating device described in PTL 1 under the condition (fclk=2f$_B$) of the above-described type 1. However, when compared to the form described in PTL 1, processing order may be changed within a scope that does not affect functions of the entire device, to facilitate comparison with FIG. 7.

In the digital signal processing unit 710 shown in FIG. 8, which is based on the conventional technology, first, an input signal is divided substantially by the frequency f$_B$ and down-converted to the baseband in a band dividing unit 711, and only an original divided signal 721 on the low-frequency side and a folded divided signal 732 that is obtained by folding back an original divided signal on the high-frequency side in a spectrum folding unit 712 are used. Downsampling is also performed as necessary together with the bandwidth division in the band dividing unit 711. In a weighted addition unit 713, the original divided signal 721 is multiplied by a constant 1 and the folded divided signal 732 is multiplied by a constant r and a constant -r, and then the results are added.

Thereafter, outputs from the weighted addition unit 713 are filtered using a subchannel response compensation filter 714 to compensate for analog response characteristics of subchannels including sub DACs, and then transmit to the sub DACs. Note that the constants are set in the weighted addition unit 713 assuming that a band analog signal generating unit at a subsequent stage basically performs ideal operation, and all response characteristics of the actual device are compensated for by the subchannel response compensation unit 714 at a subsequent stage.

Figure 9:
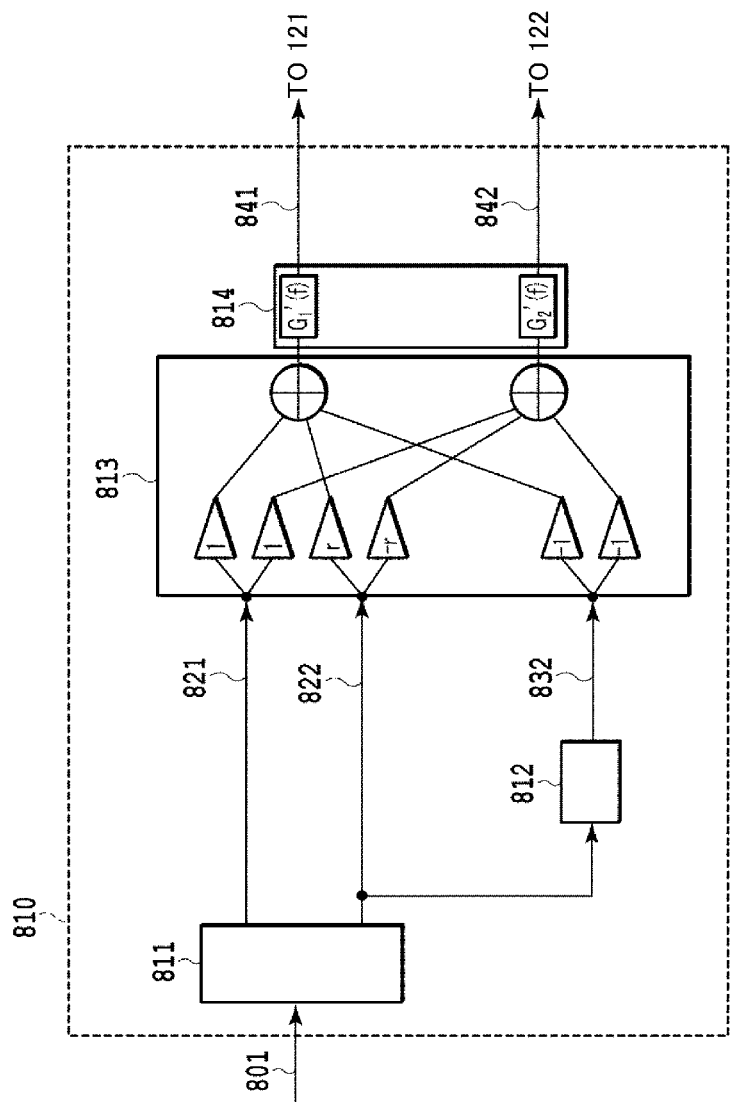
FIG. 9 is a functional block diagram of a digital signal processing unit in a conventional signal generating device under a condition (fclk=fB) of type 2.

FIG. 9 shows a functional block diagram of a digital signal processing unit 810 in the conventional signal generating device described in PTL 1 under the condition ($f_{clk}=f_B$) of the above-described type 2. However, when compared to the form described in PTL 1, processing order may be changed within a scope that does not affect functions of the entire device, to facilitate comparison with FIG. 7.

In the digital signal processing unit 810 shown in FIG. 9, which is based on the conventional technology, first, an input signal is divided substantially by the frequency $f_B$ and down-converted to the baseband in a band dividing unit 811, and only original divided signals 821 and 822 on the low-frequency side and a folded divided signal 832 that is obtained by folding back an original divided signal on the high-frequency side in a spectrum folding unit 812 are used. Downsampling is also performed as necessary together with the bandwidth division in the band dividing unit 811. In a weighted addition unit 813, the original divided signal 821 is multiplied by a constant 1, the original divided signal 822 is multiplied by a constant r and a constant -r, and the folded divided signal 832 is multiplied by a coefficient -1, and then the results are added.

Thereafter, outputs from the weighted addition unit 813 are filtered using a subchannel response compensation filter 814 to compensate for analog response characteristics of subchannels including sub DACs, and then transmit to the sub DACs. Note that the constants are set in the weighted addition unit 813 assuming that a band analog signal generating unit at a subsequent stage basically performs ideal operation, and all response characteristics of the actual device are compensated for by the subchannel response compensation unit 814 at a subsequent stage.

In the combination of the weighted addition unit 713 and the subchannel compensation unit 714 shown in FIG. 8 and the combination of the weighted addition unit 813 and the subchannel compensation unit 814 shown in FIG. 9 according to the conventional technology, filters that have frequency dependence are only two filters in the subchannel response compensation units, and therefore there is a problem in that the degree of freedom of compensation is limited and it is not possible to completely compensate for the response characteristics of the broadband analog signal generating unit 131 expressed by $R_{mq}(f)$ in Expression (2).

Specifically, with the conventional configurations shown in FIGS. 8 and 9, it is possible to compensate for individual differences between response characteristics of the sub DACs and the skew of connection portions between the sub DACs and the broadband analog signal generating unit by using the subchannel response compensation units 714 and 814, but there is a problem in that it is not possible to compensate for differences between response characteristics of the broadband analog signal generating unit 131 with respect to images of respective orders and a response with respect to an image of an order that is ideally not generated, but is generated due to incompleteness of the device.

In contrast, in the configuration of the present invention shown in FIG. 7, eight ($2M^2$) filters that have frequency dependence are provided in the 4×2 filter 613, and individually applied to each of the original divided signals and the folded divided signal. As a result of the filters being set as shown in Expression (14), it is possible to compensate for differences between response characteristics of the broadband analog signal generating unit 131 with respect to images of respective orders and a response with respect to an image of an order that is ideally not generated, but is generated due to incompleteness of the device, and generate a high-quality signal through more efficient and more precise compensation.

Note that in PTL 2 as well, it is assumed that compensation of responses is basically performed for each subchannel as shown in FIGS. 8 and 9.

Second Embodiment

Figure 10:
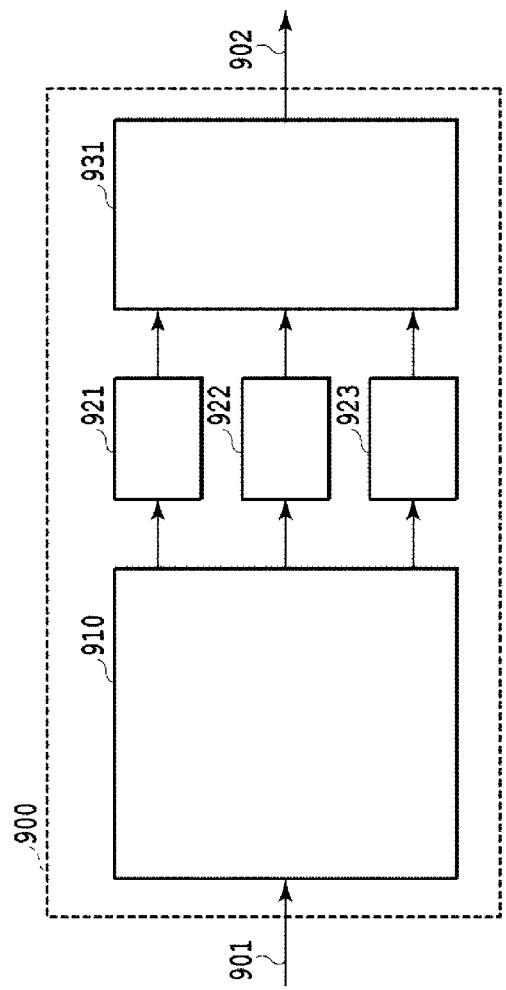
FIG. 10 is a diagram showing a configuration of a signal generating device according to a second embodiment of the present invention.

FIG. 10 is a diagram schematically showing a configuration of a signal generating device according to a second embodiment of the present invention. A signal generating device 900 is constituted by a digital signal processing unit 910 to which an input signal 901 is input, sub DACs 921 to 923, and a broadband analog signal generating unit 931 that outputs an output signal 902. When the number of sub DACs is represented by M (M is an integer equal to or greater than 2), M=3 in this example.

Assume that the analog bandwidth of the sub DACs 921 to 923 is $f_B$. The broadband analog signal generating unit 931 has a function of outputting a broadband signal in a frequency range from 0 to about $3f_B$ as the output signal 902 by generating images by shifting the frequency of each of signals input from the sub DACs 921 to 923 by an integral multiple of $f_B$ and superimposing the images.

Figure 11:
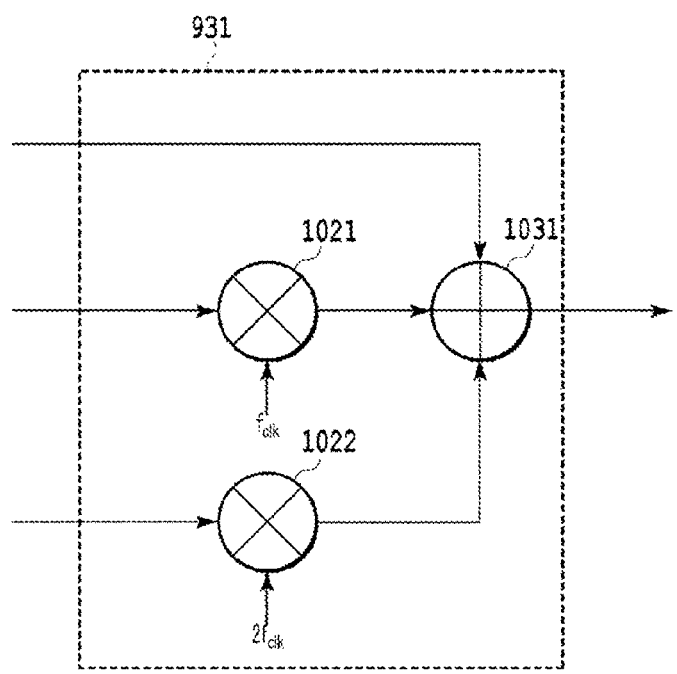
FIG. 11 is a diagram showing a specific configuration example 1 of a broadband analog signal generating unit shown in FIG. 10.
Figure 12:
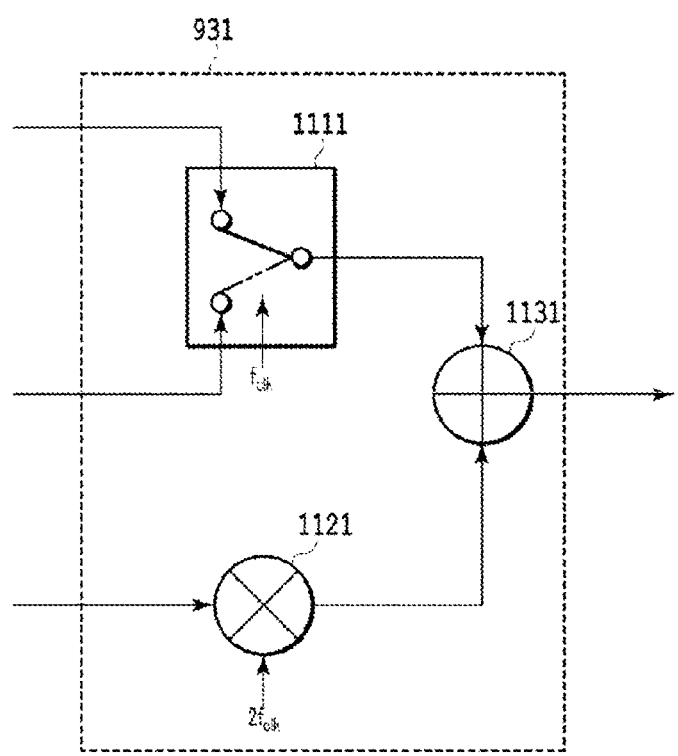
FIG. 12 is a diagram showing a specific configuration example 2 of the broadband analog signal generating unit shown in FIG. 10.

Examples of specific configurations of the broadband analog signal generating unit 931 that can be used include a configuration in which two mixers 1021 and 1022 and a combiner 1031 are used as shown in FIG. 11 and a configuration in which an analog multiplexer 1111, a mixer 1121, and a combiner 1131 are used in combination as shown in FIG. 12.

In the configuration example of the broadband analog signal generating unit 931 shown in FIG. 11, the mixer 1021 is driven at a frequency $f_{clk}=f_B$ to generate a primary image of a signal output from the sub DAC 922, and the mixer 1022 is driven at a frequency $2f_{clk}=2f_B$ to generate a secondary image of a signal output from the sub DAC 923. The triple-input combiner 1031 adds a baseband component output from the sub DAC 931 and the primary image and the secondary image generated as described above to generate a broadband signal.

In the configuration example of the broadband analog signal generating unit 931 shown in FIG. 12, the analog multiplexer 1111 is driven under the condition $f_{clk}=f_B$ of type 2 to generate a baseband component and a primary image from signals output from the sub DACs 921 and 922. The mixer 1121 is driven at $2f_{clk}=2f_B$ to generate a secondary image of a signal output from the sub DAC 923. The dual-input combiner 1131 adds the baseband component, the primary image, and the secondary image generated as described above to generate a broadband signal.

In any of the configuration examples of the broadband analog signal generating unit 931 shown in FIGS. 11 and 12, it is possible to obtain a broadband output signal 902 spanning the range from 0 to $3f_B$, which is three times the analog bandwidth of the sub DACs 921 to 923, as a result of appropriate signal processing being performed in the digital signal processing unit 910.

Figure 13:
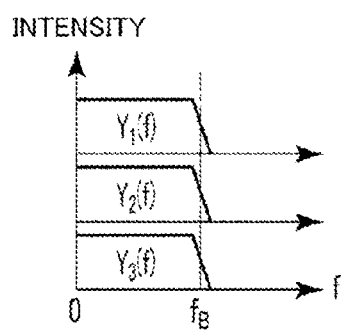
FIG. 13 is a diagram showing spectra of output signals of respective sub DACs shown in FIG. 10.
Figure 14:
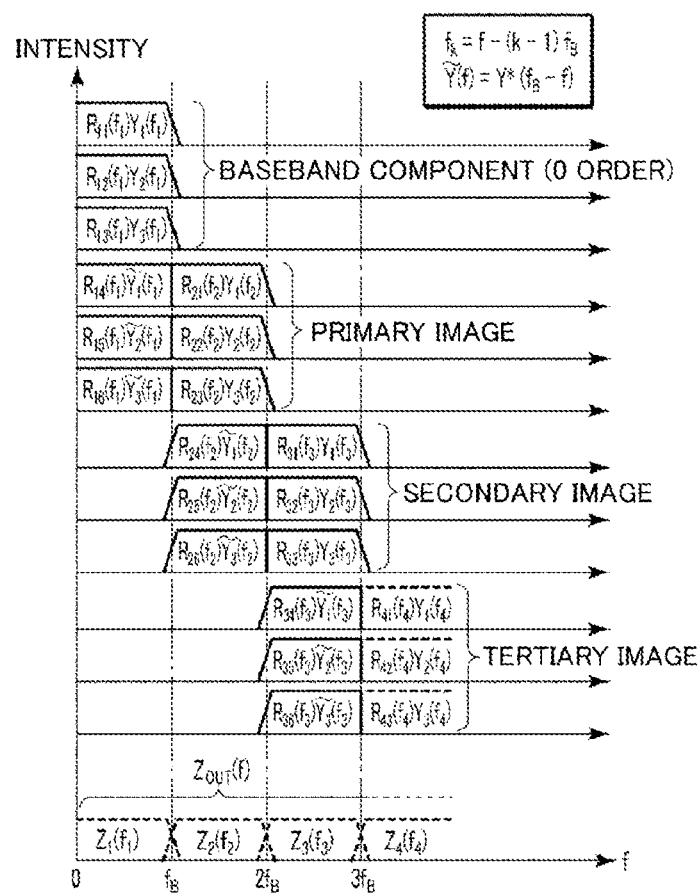
FIG. 14 is a diagram showing a spectrum of an output signal of the broadband analog signal generating unit shown in FIG. 10.

Similarly to FIG. 5 in the first embodiment, FIG. 13 is a diagram showing spectra of output signals from the sub DACs 921 to 923 in the second embodiment shown in FIG. 10, and FIG. 14 is a diagram showing a spectrum of the output signal 902 from the broadband analog signal generating unit 931.

FIG. 13 shows the spectra of the output signals from the sub DACs 921 to 923 as $Y_1(f)$ to $Y_3(f)$. FIG. 14 shows spectra of signals corresponding to the respective sub DACs from top to bottom in the order of image signals with baseband components (0 order) arranged at the top. The spectrum of the output signal 902 from the broadband analog signal generating unit 931 is shown as $Z_{OUT}(f)$ on the f axis at the bottom in FIG. 14, and portions into which $Z_{OUT}(f)$ is divided substantially by the frequency $f_B$ are shown as $Z_1(f_1)$, $Z_2(f_2)$, . . . , in that order from the low-frequency side. Explanation of symbols of spectral components of the signals used in the drawing is given at upper right in FIG. 14.

Similarly to the first embodiment described above, response characteristics of the sub DACs 921 to 923 are included in the model of the broadband analog signal generating unit 931, and accordingly, $Y_1(f)$ to $Y_3(f)$ match spectra of input digital signals input to the sub DACs 921 to 923 (to be precise, the spectra match in a frequency range that corresponds to the first Nyquist zone of the digital signals).

The following description is similarly applicable to any integer M≥2. Therefore, a variable M will be used in the following description where possible. The description can be taken to be the description of the second embodiment by assigning 3 to M.

$Y_1(f)$ to $Y_M(f)$ are spectra made of components that are substantially in a frequency range from 0 to $f_B$. $Z_{OUT}(f)$ is generated from baseband components and primary to M-th (in this example, primary to tertiary) images of $Y_1(f)$ to $Y_M(f)$. A relationship between $Z_k(f)$ and $Y_1(f)$ to $Y_M(f)$ can be expressed by the following Expression (15) using notation similar to that used in the above description of the first embodiment.

Formula 23

$$\begin{pmatrix} Z_1(f) \\ \vdots \\ Z_M(f) \\ \vdots \end{pmatrix} = \begin{pmatrix} R_{11}(f) & \cdots & R_{1M}(f) & R_{1(M+1)}(f) & \cdots & R_{1(2M)}(f) \\ \vdots & \ddots & \vdots & \vdots & \ddots & \vdots \\ R_{M1}(f) & \cdots & R_{MM}(f) & R_{M(M+1)}(f) & \cdots & R_{M(2M)}(f) \\ & & \vdots & & & \end{pmatrix} \begin{pmatrix} Y_1(f) \\ \vdots \\ Y_M(f) \\ \breve{Y}_1(f) \\ \vdots \\ \breve{Y}_M(f) \end{pmatrix} \quad (15)$$

$R_{kp}(f)$ represents a frequency response of the broadband analog signal generating unit 931, and when p=1 to M (in this example, 1 to 3), $R_{kp}(f)$ represents a frequency response with respect to an upper side band of a k−1-th image of $Y_p(f)$, and when p=M+1 to 2M (in this example, 4 to 6), $R_{kp}(f)$ represents a frequency response with respect to a lower side band of a k-th image of $Y_{p-4}(f)$.

$R_{kp}(f)$ includes not only a response with respect to an image that is generated through ideal operation but also a response with respect to a spurious component that is generated due to incompleteness of the device or the like. Also, similarly to the first embodiment described above, $R_{kp}(f)$ also includes responses (including amplitude and phase) of the sub DACs 921 to 923 at prior stages and connection portions between the sub DACs and the broadband analog signal generating unit 931. Also, similarly to the first embodiment described above, the influence of noise and nonlinear distortion is not taken into consideration in Expression (15), and the signal generating device 900 is usually used under conditions where the influence of noise and nonlinear distortion is sufficiently small.

Furthermore, similarly to the first embodiment described above, the frequency response of the broadband analog signal generating unit 931 can be treated as an M row by 2M column (in this example, 3 row by 6 column) matrix with respect to each f, focusing only on $R_{kp}(f)$: k=1 to M (in this example, 1 to 3) in Expression (15).

In a case in which the configuration example of the broadband analog signal generating unit 931 shown in FIG. 11 is used, if the operation of the mixers 1021 and 1022 and the combiner 1031 is ideal, $R_{kp}(f)$ can be expressed by the following Expression (15b).

Formula 24

$$\begin{pmatrix} R_{11}(f) & R_{12}(f) & R_{13}(f) & R_{14}(f) & R_{15}(f) & R_{16}(f) \\ R_{21}(f) & R_{22}(f) & R_{23}(f) & R_{24}(f) & R3_5(f) & R_{26}(f) \\ R_{31}(f) & R_{32}(f) & R_{33}(f) & R_{34}(f) & R_{35}(f) & R_{36}(f) \end{pmatrix} = \begin{pmatrix} 1 & 0 & 0 & 0 & 1 & 0 \\ 0 & 1 & 0 & 0 & 0 & 1 \\ 0 & 0 & 1 & 0 & 0 & 0 \end{pmatrix} \quad (15b)$$

On the other hand, in a case in which the configuration example of the broadband analog signal generating unit 931 shown in FIG. 12 is used, if the operation of the analog multiplexer 1111, the mixer 1121, and the combiner 1131 is ideal, $R_{kp}(f)$ can be expressed by the following Expression (15c).

Formula 25

$$\begin{pmatrix} R_{11}(f) & R_{12}(f) & R_{13}(f) & R_{14}(f) & R_{15}(f) & R_{16}(f) \\ R_{21}(f) & R_{22}(f) & R_{23}(f) & R_{24}(f) & R3_5(f) & R_{26}(f) \\ R_{31}(f) & R_{32}(f) & R_{33}(f) & R_{34}(f) & R_{35}(f) & R_{36}(f) \end{pmatrix} = \begin{pmatrix} 1 & 1 & 1/r & -1/r & 0 & 0 \\ 1/r & -1/r & 0 & 0 & 0 & 1 \\ 0 & 0 & 1 & 0 & 0 & 0 \end{pmatrix} \quad (15c)$$

However, an actual device does not operate as expressed by Expressions (15b) to (15c).

Usually, $R_{kp}(f)$ is not a constant as in Expressions (15b) and (15c), but depends on the frequency, and the frequency dependence (waveform of the response spectrum) also varies between elements. Also, elements that are zero in Expressions (15b) and (15c) are actually not zero. For example, $R_{21}(f)=R_{31}(f)=0$ in Expression (15b) because the baseband component ideally does not pass through the mixer, but actually, the baseband component also passes through the mixer due to incompleteness of the device, and the responses $R_{21}(f)$ and $R_{31}(f)$ are not zero. The present invention is characterized in that highly precise compensation can be performed with respect to such non-ideal responses as well.

Figure 15:
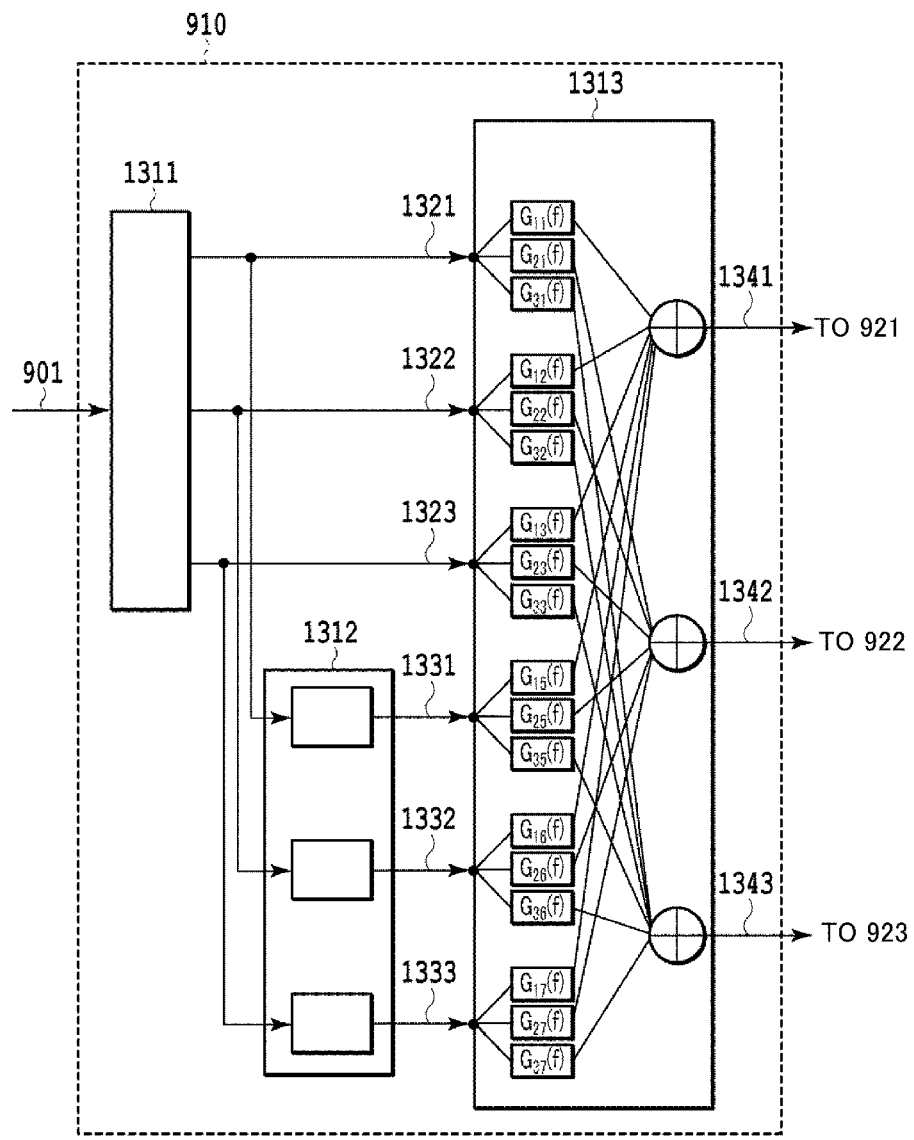
FIG. 15 is a functional block diagram of the inside of a digital signal processing unit shown in FIG. 10.

FIG. 15 shows a functional block diagram of the inside of the digital signal processing unit 910 shown in FIG. 10. The digital signal processing unit 910 generates digital signals to be transmitted to the sub DACs 921 to 923 according to characteristics of the broadband analog signal generating unit 931 generally expressed by Expression (15) such that a desired analog signal can be obtained as the final output signal 902. The input signal 901 input to the digital signal processing unit 910 corresponds to a digital signal that is obtained by sampling a desired analog signal, and is virtually generated in a digital region. Assume that $X_{target}(f)$ represents the spectrum of the input signal 901. $X_{target}(f)$ is a spectrum made of a component that is substantially in a frequency range from 0 to $Mf_B$ (in this example, from 0 to $3f_B$).

A band dividing unit 1311 generates original divided signals 1321 to 1323 that correspond to signals obtained by dividing the input signal 901 substantially by the frequency $f_B$ and down-converting the divided portions of the input signal 901 to the baseband. When spectra of the original divided signals are represented by $X_1(f)$ to $X_M(f)$ in the order shown in the drawing from the top, a relationship expressed by the following Expression (16) is satisfied.

Formula 26

$$X_{target}(f) = X_1(f) + \ldots + X_M\{f - (M-1)f_B\} = X_1(f_1) + \ldots + X_M(f_M) \quad (16)$$

At this time, $X_{k-1}(f_{k-1})$ and $X_k(f_k)$ may slightly overlap around $kf_B$. Each $X_k(f)$ is a spectrum made of a component that is substantially in the frequency range from 0 to $f_B$. The original divided signals 1321 to 1323 have a bandwidth that is about 1/M (about 1/3) of the bandwidth of the input signal 901, and accordingly, can be expressed using a sampling rate that is about 1/M (about 1/3) of the sampling rate of the input signal 901. Therefore, it is desirable that digital processing performed in the band dividing unit 1311 includes processing for performing downsampling after the bandwidth division.

In a spectrum folding unit 1312, folded divided signals 1331 to 1333 are generated by folding back the original divided signals 1321 to 1323 on the frequency axis with $f_B/2$ being the center of the fold to take the complex conjugate. Spectra of the folded divided signals 1331 to 1333 can be expressed as follows using a tilde (~) similarly to Expression (1).

$$\widetilde{X_1}(f) \sim \widetilde{X_2}(f): \widetilde{X_m}(f) = X^*_m(f_B - f) \quad \text{Formula 27}$$

A 2M×M filter (in this example, 6×3 filter) 1313 takes the original divided signals 1321 to 1323 and the folded divided signals 1331 to 1333 as inputs and generates composite signals 1341 to 1343 to be transmitted to the sub DACs 921 to 923.

As described above, in the model of Expression (15), $R_{km}(f)$ also includes responses of the sub DACs 921 to 923 and connection portions between the sub DACs and the broadband signal generating unit 931, and accordingly, spectra of these composite signals 1341 to 1343 are $Y_1(f)$ to $Y_M(f)$ in Expression (15) (to be precise, since the composite signals 941 to 942 are digital signals, the spectra of the composite signals in the first Nyquist zone match $Y_1(f)$ to $Y_M(f)$ in Expression (15)).

The operation of the 2M×M filter (in this example, 6×3 filter) 1313 can be expressed by the following Expression (17).

Formula 28

$$\begin{pmatrix} Y_1(f) \\ \vdots \\ Y_M(f) \end{pmatrix} = \begin{pmatrix} G_{11}(f) & \cdots & G_{1M}(f) & G_{1(M+1)}(f) & \cdots & G_{1(2M)}(f) \\ \vdots & \ddots & \vdots & \vdots & \ddots & \vdots \\ G_{M1}(f) & \cdots & G_{MM}(f) & G_{M(M+1)}(f) & \cdots & G_{M(2M)}(f) \end{pmatrix} \begin{pmatrix} X_1(f) \\ \vdots \\ X_M(f) \\ \widetilde{X_1}(f) \\ \vdots \\ \widetilde{X_M}(f) \end{pmatrix} \quad (17)$$

$G_{mq}(f)$ represents a response function of the 2M×M filter (in this example, 6×3 filter) 1313, m=1 to M (in this example, 1 to 3) corresponds to the composite signals 1341 to 1342 that are obtained as outputs, q=1 to M (in this example, 1 to 3) corresponds to $X_q(f)$, and q=M+1 to 2M (in this example, 4 to 6) corresponds to $$\widetilde{X_{q-4}}(f) \quad \text{Formula 29}$$

As described above, the 2M×M filter (in this example, 6×3 filter) 1313 is a filter that obtains the composite signals 1341 to 1343 by multiplying the original divided signals 1321 to 1323 and the folded divided signals 1331 to 1333 by response functions $G_{mq}(f)$ that can be independently set, and then superimposing the results. The original divided signals 1321 to 1323 and the folded divided signals 1331 to 1333 are made of components of which the frequency is substantially $f_B$ or less, and accordingly, the composite signals 1341 to 1343 are also made of components of which the frequency is substantially $f_B$ or less, and can be converted to analog signals by the sub DACs 921 to 923 of which the analog bandwidth is substantially $f_B$, with no problem.

Similarly to the first embodiment described above, if the influence of noise and nonlinear distortion is ignored, the following Expression (18) holds as a result of the response $G_{mq}(f)$ of the 2M×M filter (in this example, 6×3 filter) 1313 being appropriately set for given $R_{kp}(f)$.

Formula 30

$$\begin{pmatrix} Z_1(f) \\ \vdots \\ Z_M(f) \end{pmatrix} = \begin{pmatrix} X_1(f) \\ \vdots \\ X_M(f) \end{pmatrix} \quad (18)$$

That is, in the spectrum $Z_{OUT}(f)$ of the final output signal 902 of the signal generating device 900, the range where the frequency is substantially from 0 to $Mf_B$ (in this example, 0 to $3f_B$) can be made substantially match $X_{target}(f)$ by the digital signal processing unit 910.

Similarly to the first embodiment described above, this can be realized by setting $G_{mq}(f)$ for given $R_{kp}(f)$ as shown in Expression (19).

Formula 31

$$\begin{pmatrix} G_{11}(f) & \cdots & G_{1M}(f) \\ \vdots & \ddots & \vdots \\ G_{M1}(f) & \cdots & G_{MM}(f) \\ \widetilde{G_{1(M+1)}}(f) & \cdots & \widetilde{G_{1(2M)}}(f) \\ \vdots & \ddots & \vdots \\ \widetilde{G_{M(M+1)}}(f) & \cdots & \widetilde{G_{M(2M)}}(f) \end{pmatrix} = \quad (19)$$

$$\begin{pmatrix} R_{11}(f) & \cdots & R_{1M}(f) & R_{1(M+1)}(f) & \cdots & R_{1(2M)}(f) \\ \vdots & \ddots & \vdots & \vdots & \ddots & \vdots \\ R_{M1}(f) & \cdots & R_{MM}(f) & R_{M(M+1)}(f) & \cdots & R_{M(2M)}(f) \\ \widetilde{R_{1(M+1)}}(f) & \cdots & \widetilde{R_{1(2M)}}(f) & \widetilde{R_{11}}(f) & \cdots & \widetilde{R_{1M}}(f) \\ \vdots & \ddots & \vdots & \vdots & \ddots & \vdots \\ \widetilde{R_{M(M+1)}}(f) & \cdots & \widetilde{R_{M(2M)}}(f) & \widetilde{R_{M1}}(f) & \cdots & \widetilde{R_{MM}}(f) \end{pmatrix}^{-1}$$

$$\begin{pmatrix} 1 & \cdots & 0 \\ \vdots & \ddots & \vdots \\ 0 & \cdots & 1 \\ 0 & \cdots & 0 \\ \vdots & \ddots & \vdots \\ 0 & \cdots & 0 \end{pmatrix}$$

Expression (19) can be derived similarly to Expression (14), and therefore a description thereof is omitted.

$R_{kp}(f)$ includes all of individual differences between the response characteristics of the sub DACs 921 to 923, the skew of connection between the sub DACs 921 to 923 and the broadband analog signal generating unit 931, and response characteristics of the broadband analog signal generating unit 931 with respect to images of respective orders (including a response with respect to an image of an order that is ideally not generated, but is generated due to incompleteness of the device). Therefore, the 2M×M filter (in this example, 6×3 filter) 1313 in which $G_{mq}(f)$ are used as coefficients can compensate for all of the individual differences between the sub DACs, the skew, and differences between response characteristics for respective orders, and generate the composite signals 1341 to 1343 with which ideal DAC characteristics can be achieved by the signal generating device 900 as a whole.

Third Embodiment

Figure 16:
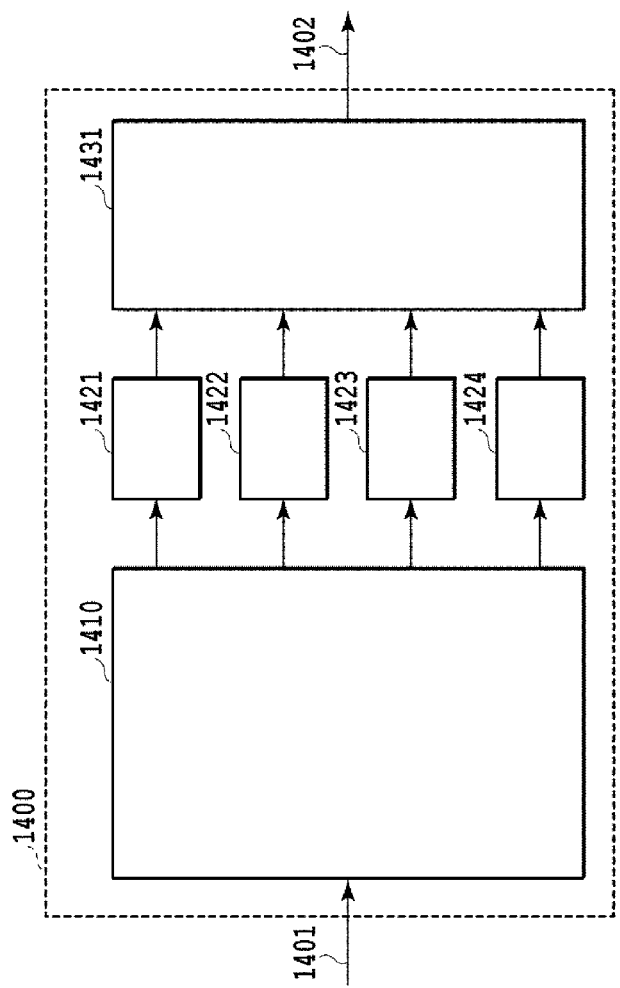
FIG. 16 is a diagram showing a configuration of a signal generating device according to a third embodiment of the present invention.

FIG. 16 is a diagram schematically showing a configuration of a signal generating device according to a third embodiment of the present invention. A signal generating device 1400 is constituted by a digital signal processing unit 1410 to which an input signal 1401 is input, sub DACs 1421 to 1424, and a broadband analog signal generating unit 1431 that outputs an output signal 1402. When the number of sub DACs is represented by M (M is an integer equal to or greater than 2), M=4 in this example.

Assume that the analog bandwidth of the sub DACs 1421 to 1424 is $f_B$. The broadband analog signal generating unit 1431 has a function of outputting a broadband signal in a frequency range from 0 to about $4f_B$ as the output signal 1402 by generating images by shifting the frequency of each of signals input from the sub DACs 1421 to 1424 by an integral multiple of $f_B$ and superimposing the images.

Figure 17:
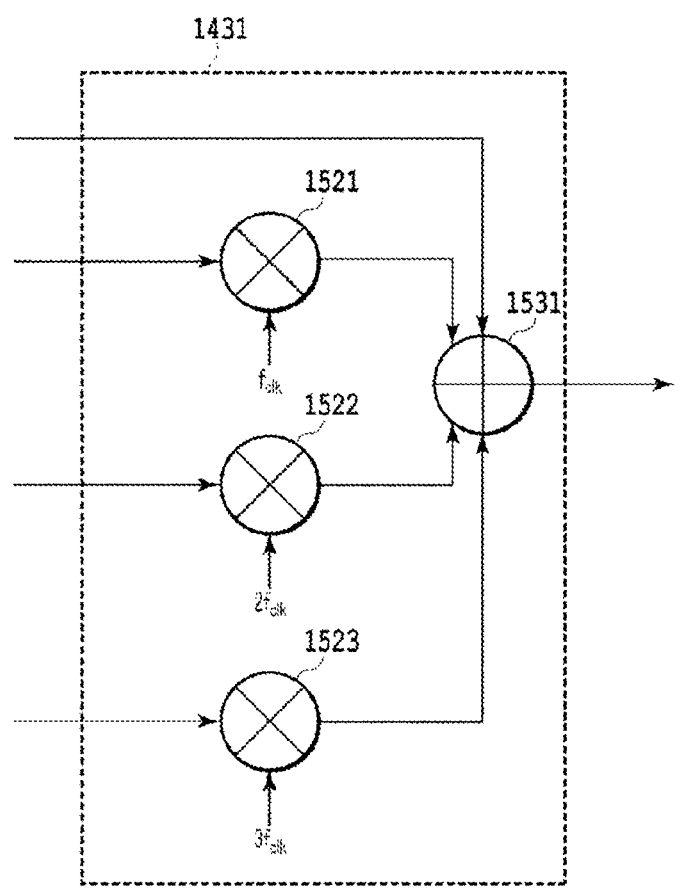
FIG. 17 is a diagram showing a specific configuration example 1 of a broadband analog signal generating unit shown in FIG. 16.
Figure 18:
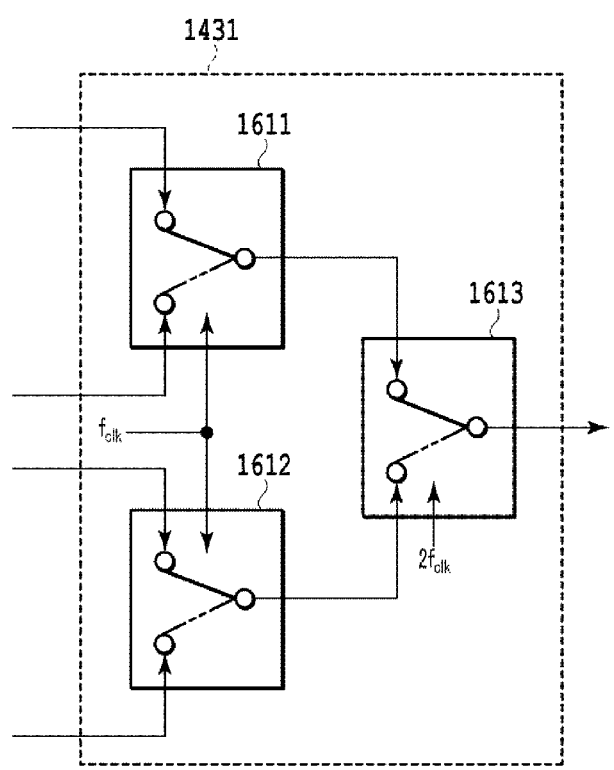
FIG. 18 is a diagram showing a specific configuration example 2 of the broadband analog signal generating unit shown in FIG. 16.

Examples of specific configurations of the broadband analog signal generating unit 1431 that can be used include a configuration in which three mixers 1521 to 1523 and a quadruple-input combiner 1531 are used as shown in FIG. 17 and a configuration in which three analog multiplexers 1611 to 1613 are connected in the form of a multistage tree as shown in FIG. 18.

In the configuration example of the broadband analog signal generating unit 1431 shown in FIG. 17, the mixer 1521 is driven at a frequency $f_{clk}=f_B$ to generate a primary image of a signal output from the sub DAC 1422. Also, the mixer 1522 is driven at a frequency $2f_{clk}=2f_B$ to generate a secondary image of a signal output from the sub DAC 1423. Furthermore, the mixer 1523 is driven at a frequency $3f_{clk}=3f_B$ to generate a tertiary image of a signal output from the sub DAC 1424. Then, the quadruple-input combiner 1531 adds these three images and a baseband component of a signal output from the sub DAC 1421 to generate a broadband signal.

In the configuration example of the broadband analog signal generating unit 1431 shown in FIG. 18, the analog multiplexer 1611 is driven under the condition $f_{clk}=f_B$ of type 2 to generate a baseband component and a primary image from signals output from the sub DACs 1421 and 1422. The analog multiplexer 1612 is driven under the condition $f_{clk}=f_B$ of type 2 to generate a baseband component and a primary image from signals output from the sub DACs 1423 and 1424. Furthermore, the analog multiplexer 1613 is driven under the condition $2f_{clk}=2f_B$ of type 2 and connected in the form of a multistage tree to generate, from signals output from the analog multiplexers 1611 and 1612, a signal having a bandwidth that is two times the bandwidth of the signals output from the analog multiplexers 1611 and 1612.

In any of the configuration examples of the broadband analog signal generating unit 1431 shown in FIGS. 17 and 18, it is possible to obtain a broadband output signal 1402 spanning the range from 0 to $4f_B$, which is four times the analog bandwidth of the sub DACs 1421 to 1424, as a result of appropriate signal processing being performed in the digital signal processing unit 1410.

Figure 19:
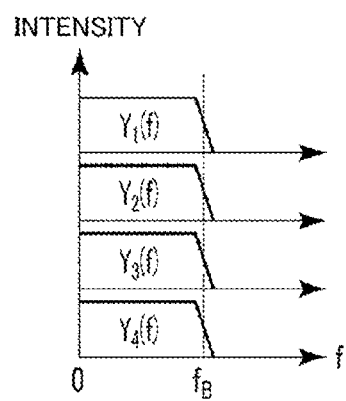
FIG. 19 is a diagram showing spectra of output signals of respective sub DACs shown in FIG. 16.
Figure 20:
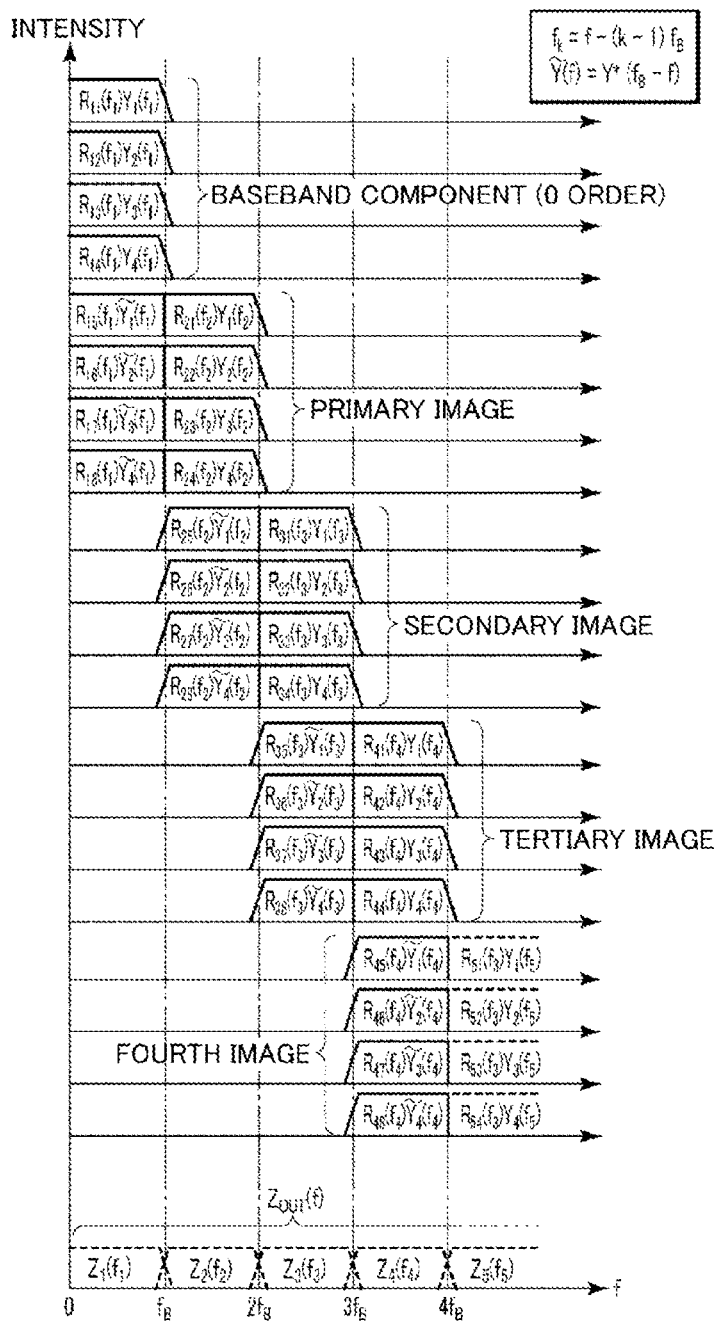
FIG. 20 is a diagram showing a spectrum of an output signal of the broadband analog signal generating unit shown in FIG. 16.

Similarly to FIG. 5 in the first embodiment and FIG. 13 in the second embodiment, FIG. 19 is a diagram showing spectra of output signals from the sub DACs 1421 to 1424 in the third embodiment shown in FIG. 16, and FIG. 20 is a diagram showing a spectrum of the output signal 1402 from the broadband analog signal generating unit 1431.

FIG. 19 shows the spectra of the output signals from the sub DACs 1421 to 1424 as $Y_1(f)$ to $Y_4(f)$. FIG. 20 shows spectra of signals corresponding to the respective sub DACs from top to bottom in the order of image signals with baseband components (0 order) arranged at the top. The spectrum of the output signal 1402 from the broadband analog signal generating unit 1431 is shown as $Z_{OUT}(f)$ on the f axis at the bottom in FIG. 20, and portions into which $Z_{OUT}(f)$ is divided substantially by the frequency $f_B$ are shown as $Z_1(f_1)$, $Z_2(f_2)$, ..., in that order from the low-frequency side. Explanation of symbols of spectral components of the signals used in the drawing is given at upper right in FIG. 20.

Similarly to the first and second embodiments described above, response characteristics of the sub DACs 1421 to 1424 are included in the model of the broadband analog signal generating unit 1431, and accordingly, $Y_1(f)$ to $Y_4(f)$ match spectra of input digital signals input to the sub DACs 1421 to 1424 (to be precise, the spectra match in a frequency range that corresponds to the first Nyquist zone of the digital signals). A relationship between $R_{kp}(f)$ representing the frequency response of the broadband analog signal generating unit 1431, $Y_1(f)$ to $Y_4(f)$, and $Z_1(f)$ to $Z_4(f)$ corresponds to a case where M=4 in the above-described Expression (15) and the description thereof.

Figure 21:
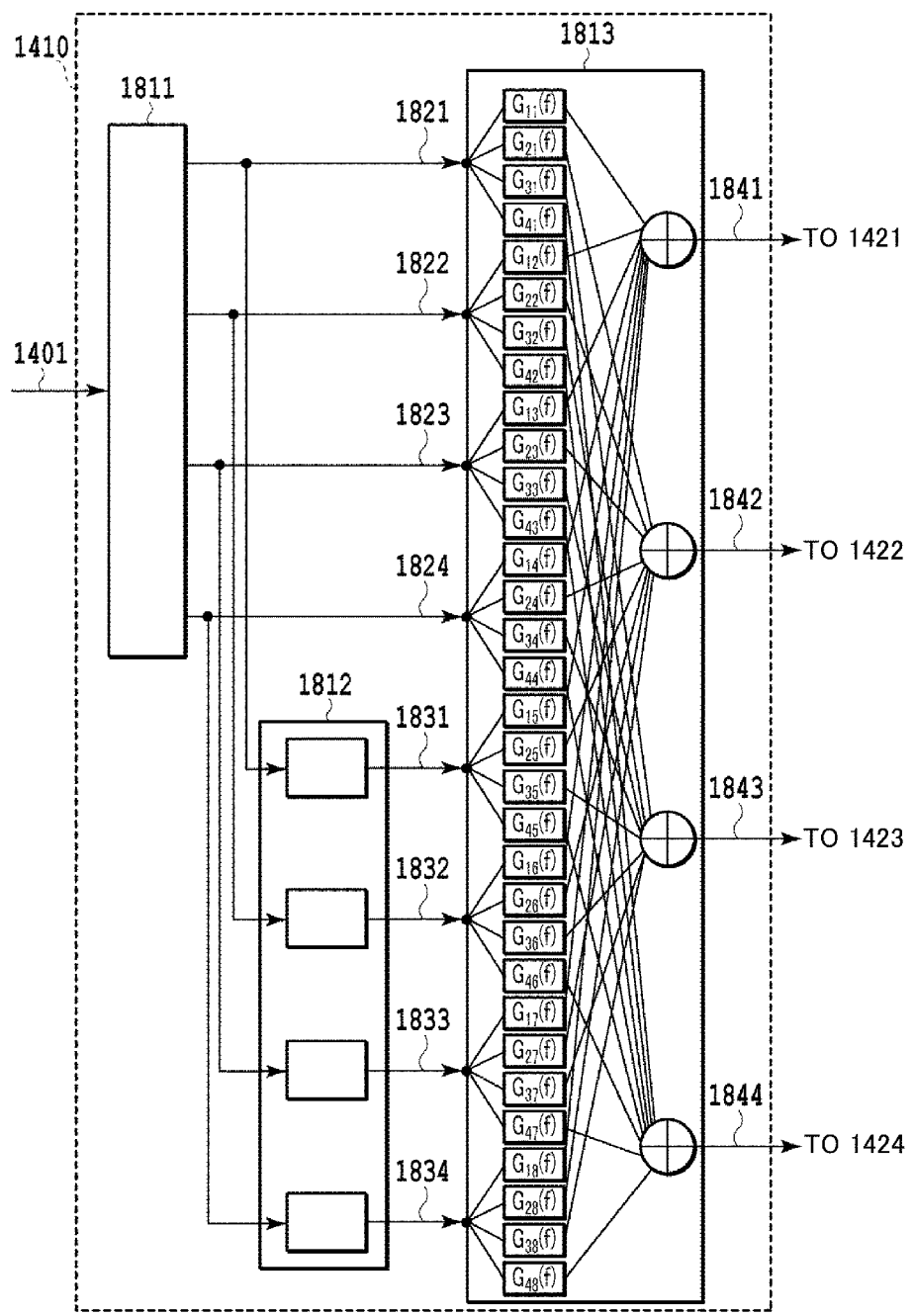
FIG. 21 is a functional block diagram of the inside of a digital signal processing unit shown in FIG. 16.

FIG. 21 shows a functional block diagram of the inside of the digital signal processing unit 1410 shown in FIG. 16. A description of the digital signal processing unit 1410 corresponds to a case where the value of M is changed from 3 to 4 in the above description of the digital signal processing unit 910 in the second embodiment. As a result of the response function $G_{mq}(f)$ of a 2M×M filter (in this example, 8×4 filter) 1813 being set for given $R_{kp}(f)$ in accordance with Expression (19), in the spectrum $Z_{OUT}(f)$ of the final output signal 1402 of the signal generating device 1400, the range where the frequency is substantially from 0 to $Mf_B$ (in this example, 0 to $4f_B$) can be made substantially match $X_{target}(f)$ by the digital signal processing unit 1410.

$R_{kp}(f)$ includes all of individual differences between response characteristics of the sub DACs 1421 to 1424, the skew of connection between the sub DACs 1421 to 1424 and the broadband analog signal generating unit 1431, and response characteristics of the broadband analog signal generating unit 1431 with respect to images of respective orders (including a response with respect to an image of an order that is ideally not generated, but is generated due to incompleteness of the device). Therefore, the 2M×M filter (in this example, 8×4 filter) 1813 in which $G_{mq}(f)$ are used as coefficients can compensate for all of the individual differences, the skew, and differences between response characteristics for respective orders, and generate composite signals 1841 to 1844 with which ideal DAC characteristics can be achieved by the signal generating device 1400 as a whole.

Functions and Effects (Reduction in Computation Amount) of the Invention

Functions and effects of the present invention will be examined from the standpoint of the amount of computation. In a conventional technology, digital compensation means is proposed in which a spectrum X of a desired signal is expressed by a digital waveform using N samples and is multiplied by an N×N matrix H for compensating for incompleteness of device response to obtain a signal P, and thereafter the spectrum of P is divided and transmitted to sub DACs (NPL 2). That is, crosstalk between all frequency components is taken into consideration to compensate for incompleteness of the device, but there is a problem in that the amount of computation required for the compensation increases by $N^2$.

On the other hand, the present invention is based on a new idea of grasping the system based on original divided signals and folded divided signals, taking these divided signals as inputs, and applying a 2M×M filter to compensate for incompleteness of the device. When compared to the conventional method, the present invention has a significant merit in that the load of computation necessary to achieve compensation precision equivalent to that achieved in the conventional method is significantly reduced.

The conventional method and the present invention will be specifically compared in terms of computational load. Assume a case in which a broadband signal in a frequency range from 0 to $Mf_B$ is generated using M sub DACs. When a frequency resolution of a filter required for appropriately performing compensation is df, in the conventional method, the number N of samples is: $N=Mf_B/df$, and the number of elements of the compensation matrix H, i.e., the number of coefficients required for the compensation is $N^2$.

On the other hand, in the present invention, the frequency range of the divided signals is 0 to $f_B$, and accordingly, the number of samples for each filter portion constituting the 2M×M filter is $f_B/df$, and the total number of coefficients is $2M^2f_B/df=2MN$. That is, the ratio between the number of coefficients used for the compensation in the present invention and the number of coefficients used for the compensation in the conventional method is 2M:N.

In practice, M is about 2 to 16, and if M=2, the computational load of the compensation filter of the present invention is smaller than that of the conventional method when N>4, and even if M=16, the computational load of the compensation filter of the present invention is smaller than that of the conventional method when N>32. For example, when $f_{MAX}$=64 GHz, N=4 corresponds to df=16 GHz and N=32 corresponds to df=2 GHz, but these resolutions cannot be said as being sufficient, and it is desirable to set N to a larger value to perform highly precise compensation.

Typically, it is desirable to perform compensation with a resolution of at least 1 GHz, which corresponds to N=64 under the above-described conditions, and accordingly, if M=2, the number of coefficients used in the present invention is 1/16 of that in the conventional method, and even if M=16, the number of coefficients used in the present invention is 1/2 of that in the conventional method. If $f_B$ is increased, N required for achieving the same resolution is naturally increased, and the present invention becomes more advantageous.

Note that, regarding the precision of compensation, responses of the sub DACs and the broadband analog signal generating unit can be almost completely described using $R_{kp}(f)$ (k=1 to M, p=1 to 2M) in view of the operation principle shown in FIGS. 6, 14, and 20 of the present specification, and therefore it can be understood that compensation can be sufficiently performed if $G_{mq}(f)$ (m=1 to M, q=1 to 2M) is set as shown in the above Expression (14), and improvement in the precision of compensation can be hardly expected even if compensation is performed using an N×N matrix including a larger number of coefficients. Therefore, assuming the use of a realistic number of sub DACs, the use of the present invention is advantageous from the standpoint of the computational load of the DSP to perform compensation in a broad signal band with a sufficiently high resolution.

From a different viewpoint, it can also be said that the conventional compensation performed using the N×N matrix involves many unnecessary computations as a result of the entire system being treated as a complete black box, but in the present invention, computation is efficiently performed as a result of the number of coefficients required for the compensation being reduced to 2MN in view of the operation principle of the system.

Fourth Embodiment

Figure 22:
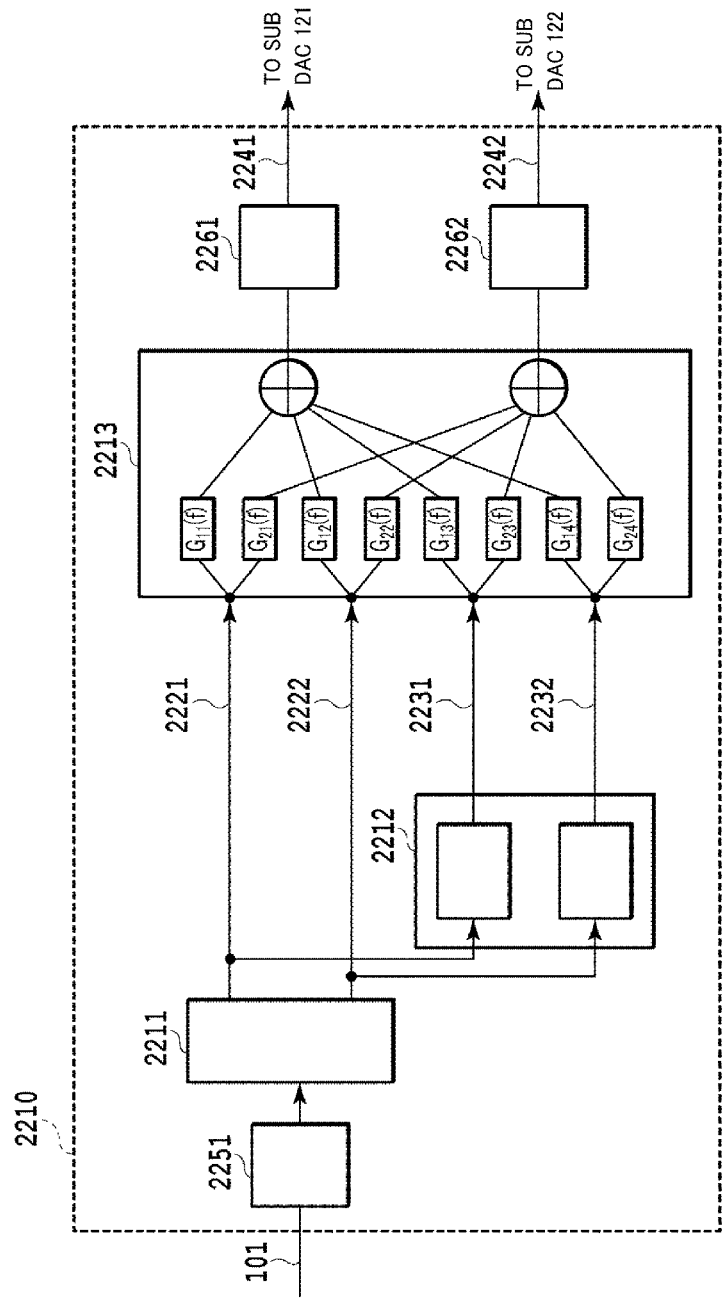
FIG. 22 is a diagram showing a configuration of a signal generating device according to a fourth embodiment of the present invention.

A signal generating device according to a fourth embodiment of the present invention has a configuration that is similar to the configuration of the signal generating device according to the first embodiment shown in FIG. 1 and in which a digital signal processing unit 2210 shown by an internal functional block diagram of FIG. 22 is used instead of the digital signal processing unit 110. When compared to the digital signal processing unit 110 shown in FIG. 7, the digital signal processing unit 2210 shown in FIG. 22 additionally includes a main nonlinear filter 2251 at a stage prior to a band dividing unit 2211 and sub nonlinear filters 2261 and 2262 at stages subsequent to a 4×2 filter (2M×M filter) 2213.

The influence of nonlinear distortion is taken into consideration in the configuration of the present embodiment. In the first to third embodiments described above, the influence of nonlinear distortion is not taken into consideration as described about Expression (2), assuming that the signal generating device is used under conditions where the influence of nonlinear distortion is sufficiently small. However, in practice, there may arise a problem of degradation of characteristics due to nonlinear distortion in a case in which the amplitude of the output signal is increased, for example. In such a case, it is desirable compensate for the nonlinear distortion by adding nonlinear filters (nonlinear predistorters) to the digital signal processing unit.

In the signal generating device of the present invention, two types of nonlinear distortion need to be considered. That is, nonlinear distortion that occurs in an analog region before a broadband signal is generated and nonlinear distortion that occurs in an analog region after the broadband signal is generated. In the following description, the former will be referred to as subchannel nonlinear distortion and the latter will be referred to as main channel nonlinear distortion. The subchannel nonlinear distortion includes nonlinear distortion that occurs at sub DACs and nonlinear distortion that occurs at an input side circuit (input buffer amplifier or the like) of the broadband analog signal generating unit. On the other hand, the main channel nonlinear distortion includes nonlinear distortion that occurs at an output side circuit (output buffer amplifier or the like) of the broadband analog signal generating unit and nonlinear distortion that occurs at an optical modulator connected to a stage subsequent to the broadband analog signal generating unit.

In the case of nonlinear processing, basically, the order of steps cannot be changed and the bandwidth cannot be divided, unlike linear processing. Nonlinear filters need to be separately arranged in appropriate order to compensate for the subchannel nonlinear distortion and the main channel nonlinear distortion. Specifically, the main channel nonlinear distortion can be compensated for by performing nonlinear compensation on the entire broadband signal to be obtained as the final output, and therefore can be compensated for by adding the main nonlinear filter 2251 to the stage prior to the band dividing unit 2211 of the digital signal processing unit 2210. On the other hand, the subchannel nonlinear distortion can be compensated for by performing nonlinear compensation on composite signals to be transmitted to the sub DACs, and therefore can be compensated for by adding the sub nonlinear filters 2261 and 2262 to the stages subsequent to the 4×2 filter (2M×M filter) 2213 of the digital signal processing unit.

It is possible to use nonlinear filters that are commonly used as nonlinear compensation means for analog electronic components or optical modulators, and examples of specific configurations of the nonlinear filters include a Volterra filter and a Memory Polynomial filter. The filter coefficient can be optimized based on simulation results or data actually measured using a test signal. As an algorithm of the optimization, it is possible to use a direct learning method or an indirect learning method as described in NPL 4, for example.

Although M=2 in the configuration of the present embodiment, it is apparent that a similar configuration can also be used when M=3 or more. For example, in the configuration shown in FIG. 10 where M=3, the main channel nonlinear distortion and the subchannel nonlinear distortion can be compensated for by arranging a main nonlinear filter at a stage prior to the band dividing unit 1311 and arranging sub nonlinear filters at stages subsequent to output ports of the 6×3 filter (2M×M filter) 1313 in the digital signal processing unit shown in FIG. 15.

Also, both of the main channel nonlinear distortion and the subchannel nonlinear distortion are compensated for in the configuration of the present embodiment, but it is also possible to use only the main nonlinear filter 2251 or only the sub nonlinear filters 2261 and 2262 in a case in which only one type of distortion is the problem or a case in which both types of distortion are problems but compensation is performed for only one type of distortion in view of complexity of the circuit configuration. This also applies to cases where M≥3.

The following more specifically describes the need to arrange the main nonlinear filter and the sub nonlinear filters as in the fourth embodiment. Basically, the fourth embodiment corresponds to the first embodiment with the function of nonlinear compensation added thereto. Although it may seem possible to add the function of nonlinear compensation to the first embodiment by adopting a configuration in which eight response functions $G_{m_q}(f)$ included in the 4×2 filter (2M×M filter) 613 shown in FIG. 7 are replaced with nonlinear functions (hereinafter referred to as a component-by-component divided configuration), actually, nonlinear distortion cannot be correctly compensated for by using the component-by-component divided configuration.

This is because signals that are actually generated as analog signals are output signals from the sub DACs 121 and 122 and the output signal 102 from the broadband signal generating unit 131, and these signals are basically linear combination of four components, i.e., the original divided signals 621 and 622 and the folded divided signals 631 and 632 (hereinafter simply referred to as four components). Therefore, a signal obtained as a result of these actual analog signals undergoing nonlinear distortion due to characteristics of an actual analog device includes not only power components of the four components but also a product component of the four components. However, with the above-described component-by-component divided configuration, compensation can be performed with respect to the power components of the four components, but cannot be performed with respect to the product component of the four components.

On the other hand, in the configuration shown in FIG. 22, a signal that is input to the band dividing unit 2211 includes the four components at approximately the same proportion as the output signal 102 from the broadband signal generating unit 131, and signals that are output from the 4×2 filter (2M×M filter) 2213 include the four components at approximately the same proportion as output signals from the sub DACs 121 and 122, and accordingly, as a result of the main nonlinear filter 2251 and the sub nonlinear filters 2261 and 2262 that take these signals as inputs being used, it is possible to correctly compensate for power components of the four components and a product component of the four components.

Actually, nonlinear distortion that occurs at the broadband analog signal generating unit 131 may vary between respective orders of images (hereinafter referred to as differences between nonlinear response characteristics for respective orders), similarly to the above-described linear response, and it is not necessarily possible to completely compensate for all nonlinear distortion with the configuration shown in FIG. 22. However, the signal generating device of the present invention is used in a range where the response is approximately linear, and the intensity of nonlinear distortion (intensity of a component deviating from an ideal signal due to nonlinear distortion) is very small (typically, −10 dB or less) relative to the signal intensity. The above-described differences between nonlinear response characteristics for respective orders are even smaller relative to the intensity of nonlinear distortion, and therefore the influence of the differences is sufficiently small.

INDUSTRIAL APPLICABILITY

According to the present invention, a high-quality signal can be generated through highly precise compensation with a computational load smaller than those in conventional technologies, in a signal generating device that can generate a signal of a bandwidth broader than an output bandwidth of a single sub DAC by using a plurality of sub DACs and a high-speed analog device.

REFERENCE SIGNS LIST 100, 900, 1400 Signal generating device
101, 701, 801, 901, 1401 Input signal
102, 902, 1402 Output signal
110, 710, 810, 910, 1410, 2210 Digital signal processing unit
121-122, 921-923, 1421-1424 Sub DAC
131, 931, 1431 Broadband analog signal generating unit
211, 1111, 1611-1613 Analog multiplexer
321, 421, 422, 1021, 1022, 1121, 1521-1523 Mixer
331, 431, 1031, 1131, 1531 Combiner
441 90-degree phase shifter
611, 711, 811, 1311, 1811, 2211 Band dividing unit
621, 622, 721, 821, 822, 1321-1323, 1821-1824, 2221, 2222 Original divided signal
631, 632, 732, 832, 1331-1333, 1831-1834, 2231, 2232 Folded divided signal
613, 1313, 1813, 2213 2M×M filter
641, 642, 741, 742, 841, 842, 1341-1343, 1841-1844, 2241, 2242 Composite signal
713, 813 Weighted addition unit
612, 712, 812, 1312, 1812, 2212 Spectrum folding unit
714, 814 Subchannel response compensation filter
2251 Main nonlinear filter
2261, 2262 Sub nonlinear filter

The invention claimed is:
1. A signal generating device comprising:
a digital signal processing unit;
M sub DACs of which an analog bandwidth is $f_B$, M being an integer equal to or greater than 2; and
a broadband analog signal generating unit configured to generate a broadband analog signal that includes a component of a frequency of $(M-1)f_B$ or more by using M analog signals output from the M sub DACs, wherein the digital signal processing unit includes means for generating M original divided signals that correspond to signals obtained by dividing a desired output signal into M portions on a frequency axis and down-converting the portions to the baseband, means for generating M folded divided signals by folding back the M original divided signals on the frequency axis, and a 2M×M filter that takes the M original divided signals and the M folded divided signals as inputs and outputs M composite signals to be transmitted to the M sub DACs, and the 2M×M filter is capable of setting a response function independently for each of $2M^2$ combinations of input and output, wherein the broadband analog signal generating unit is any of an analog multiplexer that outputs two input signals while switching the input signals at high speed at a constant frequency, a circuit in which the analog multiplexer is connected in the form of a multistage tree, a circuit in which at least M-1 input signals of M input signals are up-converted in frequencies by using a mixer, and then combined and output, and a circuit in which the analog multiplexer and the mixer are used in combination.

2. The signal generating device according to claim 1, wherein, when $R_{kp}(f)$ represents a frequency response of the broadband analog signal generating unit, the response function $G_{mq}(f)$ of the 2M×M filter independently set for each of $2M^2$ combinations of input and output is determined by the following expression $$\begin{pmatrix} G_{11}(f) & \cdots & G_{1M}(f) \\ \vdots & \ddots & \vdots \\ G_{M1}(f) & \cdots & G_{MM}(f) \\ \widetilde{G}_{1(M+1)}(f) & \cdots & \widetilde{G}_{1(2M)}(f) \\ \vdots & \ddots & \vdots \\ \widetilde{G}_{M(M+1)}(f) & \cdots & \widetilde{G}_{M(2M)}(f) \end{pmatrix} =$$

$$\begin{pmatrix} R_{11}(f) & \cdots & R_{1M}(f) & R_{1(M+1)}(f) & \cdots & R_{1(2M)}(f) \\ \vdots & \ddots & \vdots & \vdots & \ddots & \vdots \\ R_{M1}(f) & \cdots & R_{MM}(f) & R_{M(M+1)}(f) & \cdots & R_{M(2M)}(f) \\ \widetilde{R}_{1(M+1)}(f) & \cdots & \widetilde{R}_{1(2M)}(f) & \widetilde{R}_{11}(f) & \cdots & \widetilde{R}_{1M}(f) \\ \vdots & \ddots & \vdots & \vdots & \ddots & \vdots \\ \widetilde{R}_{M(M+1)}(f) & \cdots & \widetilde{R}_{M(2M)}(f) & \widetilde{R}_{M1}(f) & \cdots & \widetilde{R}_{MM}(f) \end{pmatrix}^{-1} \begin{pmatrix} 1 & \cdots & 0 \\ \vdots & \ddots & \vdots \\ 0 & \cdots & 1 \\ 0 & \cdots & 0 \\ \vdots & \ddots & \vdots \\ 0 & \cdots & 0 \end{pmatrix}$$

where the tilde symbol ~ represents a folding operation in which an original function is folded back with $f_B/2$ being the center of the fold to take the complex conjugate, $f_B$ being the analog bandwidth of the sub DACs.

3. The signal generating device according to claim 2, wherein the digital signal processing unit includes at least either a main nonlinear filter that is connected to an input side of the means for generating the original divided signals or M sub nonlinear filters that are respectively connected to M outputs of the 2M×M filter.

4. A signal generating device comprising:
a digital signal processing unit;
M sub DACs of which an analog bandwidth is $f_B$, M being an integer equal to or greater than 2; and
a broadband analog signal generating unit configured to generate a broadband analog signal that includes a component of a frequency of $(M-1)f_B$ or more by using M analog signals output from the M sub DACs, wherein the digital signal processing unit includes means for generating M original divided signals that correspond to signals obtained by dividing a desired output signal into M portions on a frequency axis and down-converting the portions to the baseband, means for generating M folded divided signals by folding back the M original divided signals on the frequency axis, and a 2M×M filter that takes the M original divided signals and the M folded divided signals as inputs and outputs M composite signals to be transmitted to the M sub DACs, and the 2M×M filter is capable of setting a response function independently for each of $2M^2$ combinations of input and output,
wherein, when $Rk_p(f)$ represents a frequency response of the broadband analog signal generating unit, the response function $G_{mq}(f)$ of the 2M×M filter independently set for each of $2M^2$ combinations of input and output is determined by the following expression $$\begin{pmatrix} G_{11}(f) & \cdots & G_{1M}(f) \\ \vdots & \ddots & \vdots \\ G_{M1}(f) & \cdots & G_{MM}(f) \\ \widetilde{G}_{1(M+1)}(f) & \cdots & \widetilde{G}_{1(2M)}(f) \\ \vdots & \ddots & \vdots \\ \widetilde{G}_{M(M+1)}(f) & \cdots & \widetilde{G}_{M(2M)}(f) \end{pmatrix} =$$

$$\begin{pmatrix} R_{11}(f) & \cdots & R_{1M}(f) & R_{1(M+1)}(f) & \cdots & R_{1(2M)}(f) \\ \vdots & \ddots & \vdots & \vdots & \ddots & \vdots \\ R_{M1}(f) & \cdots & R_{MM}(f) & R_{M(M+1)}(f) & \cdots & R_{M(2M)}(f) \\ \widetilde{R}_{1(M+1)}(f) & \cdots & \widetilde{R}_{1(2M)}(f) & \widetilde{R}_{11}(f) & \cdots & \widetilde{R}_{1M}(f) \\ \vdots & \ddots & \vdots & \vdots & \ddots & \vdots \\ \widetilde{R}_{M(M+1)}(f) & \cdots & \widetilde{R}_{M(2M)}(f) & \widetilde{R}_{M1}(f) & \cdots & \widetilde{R}_{MM}(f) \end{pmatrix}^{-1} \begin{pmatrix} 1 & \cdots & 0 \\ \vdots & \ddots & \vdots \\ 0 & \cdots & 1 \\ 0 & \cdots & 0 \\ \vdots & \ddots & \vdots \\ 0 & \cdots & 0 \end{pmatrix}$$

where the tilde symbol ~ represents a folding operation in which an original function is folded back with $f_B/2$ being the center of the fold to take the complex conjugate, $f_B$ being the analog bandwidth of the sub DACs.

5. The signal generating device according to claim 4, wherein the broadband analog signal generating unit is an IQ modulator circuit that is constituted by two mixers, a combiner, and a 90-degree phase shifter.

6. The signal generating device according to claim 5, wherein the digital signal processing unit includes at least either a main nonlinear filter that is connected to an input side of the means for generating the original divided signals or M sub nonlinear filters that are respectively connected to M outputs of the 2M×M filter.

7. The signal generating device according to claim 4, wherein the digital signal processing unit includes at least either a main nonlinear filter that is connected to an input side of the means for generating the original divided signals or M sub nonlinear filters that are respectively connected to M outputs of the 2M×M filter.

8. A signal generating device comprising:
a digital signal processing unit;
M sub DACs of which an analog bandwidth is $f_B$, M being an integer equal to or greater than 2; and
a broadband analog signal generating unit configured to generate a broadband analog signal that includes a component of a frequency of $(M-1)f_B$ or more by using M analog signals output from the M sub DACs, wherein the digital signal processing unit includes means for generating M original divided signals that correspond to signals obtained by dividing a desired output signal into M portions on a frequency axis and down-converting the portions to the baseband, means for generating M folded divided signals by folding back the M original divided signals on the frequency axis, and a 2M×M filter that takes the M original divided signals and the M folded divided signals as inputs and outputs M composite signals to be transmitted to the M sub DACs, and the 2M×M filter is capable of setting a response function independently for each of $2M^2$ combinations of input and output,
wherein the broadband analog signal generating unit is any of an analog multiplexer that outputs two input signals while switching the input signals at high speed at a constant frequency, a circuit in which the analog multiplexer is connected in the form of a multistage tree, a circuit in which at least M-1 input signals of M input signals are up-converted in frequencies by using a mixer, and then combined and output, and a circuit in which the analog multiplexer and the mixer are used in combination,
wherein the digital signal processing unit includes at least either a main nonlinear filter that is connected to an input side of the means for generating the original divided signals or M sub nonlinear filters that are respectively connected to M outputs of the 2M×M filter.

* * * * *